(12) United States Patent
Somekh et al.

(10) Patent No.: US 6,640,151 B1
(45) Date of Patent: Oct. 28, 2003

(54) MULTI-TOOL CONTROL SYSTEM, METHOD AND MEDIUM

(75) Inventors: Sasson Somekh, Los Altos Hills, CA (US); Howard E. Grunes, Santa Cruz, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/469,227

(22) Filed: Dec. 22, 1999

(51) Int. Cl.$^7$ .......................... G06F 19/00; H01L 21/00
(52) U.S. Cl. ...................... 700/121; 700/100; 700/108; 700/116; 438/11
(58) Field of Search ............................... 700/9, 44, 96, 700/99, 100, 108, 109, 116, 121; 438/5, 11, 13

(56) References Cited

U.S. PATENT DOCUMENTS

| | | |
|---|---|---|
| 3,205,485 A | 9/1965 | Noltingk |
| 3,229,198 A | 1/1966 | Libby |
| 4,000,458 A | 12/1976 | Miller et al. |

(List continued on next page.)

FOREIGN PATENT DOCUMENTS

| | | |
|---|---|---|
| CA | 2050247 | 8/1991 |
| CA | 2165847 | 8/1991 |
| CA | 2194855 | 8/1991 |

(List continued on next page.)

OTHER PUBLICATIONS

Hu, Albert, Kevin Nguyen, Steve Wong, Xiuhua Zhang, Emanuel Sachs, and Peter Renteln. 1993. "Concurrent Deployment of Run by Run Controller Using SCC Framework." IEEE/SEMI International Semiconductor Manufacturing Science Symposium. pp. 126–132.

Hu, Albert, He Du, Steve Wong, Peter Renteln, and Emanuel Sachs. 1994. "Application of Run by Run Controller to the Chemical–Mechanical Planarization Process." IEEE/CPMT International Electronics Manufacturing Technology Symposium. pp. 371–378.

Smith, Taber, Duane Boning, James Moyne, Arnon Hurwitz, and John Curry. Jun. 1996. "Compensating for CMP Pad Wear Using Run by Run Feedback Control." Proceedings of the Thirteenth International VLSI Multilevel Interconnection Conference. pp. 437–439.

*Primary Examiner*—Leo Picard
*Assistant Examiner*—Elliot Frank
(74) *Attorney, Agent, or Firm*—Hale & Dorr

(57) ABSTRACT

A system/method for interactively monitoring and adjusting product output from a module that includes two or more preparation tools. The output is a result of the coordinated effort of the two or more semiconductor preparation tools making up the module. The first of the tools is capable of implementing a first process on a semiconductor product and producing a first output. The second of the tools is configured to receive as input the first output from the first tool. The second tool is also capable of implementing a second process on the semiconductor product and producing a second output. A module control mechanism is capable of facilitating the exchange of information between the first tool and the second tool so that the module yields a desired semiconductor product output. Certain information can also be exchanged between the first and second tools. Other system/method embodiments for output/production control are also envisioned.

24 Claims, 10 Drawing Sheets

U.S. PATENT DOCUMENTS

| | | |
|---|---|---|
| 4,302,721 A | 11/1981 | Urbanek et al. |
| 4,698,766 A | 10/1987 | Entwistle et al. |
| 4,750,141 A | 6/1988 | Judell et al. |
| 4,757,259 A | 7/1988 | Charpentier |
| 4,796,194 A | 1/1989 | Atherton ..................... 364/468 |
| 4,938,600 A | 7/1990 | Into |
| 4,967,381 A | 10/1990 | Lane et al. |
| 5,089,970 A | 2/1992 | Lee et al. ................... 364/468 |
| 5,108,570 A | 4/1992 | Wang |
| 5,208,765 A | 5/1993 | Turnbull |
| 5,220,517 A | 6/1993 | Sierk et al. |
| 5,226,118 A | 7/1993 | Baker et al. |
| 5,231,585 A | 7/1993 | Kobayashi et al. |
| 5,236,868 A | 8/1993 | Nulman |
| 5,260,868 A | 11/1993 | Gupta et al. |
| 5,270,222 A | 12/1993 | Moslehi |
| 5,283,141 A | 2/1994 | Yoon et al. |
| 5,295,242 A | 3/1994 | Mashruwala et al. |
| 5,309,221 A | 5/1994 | Fischer et al. .............. 356/355 |
| 5,329,463 A | 7/1994 | Sierk et al. |
| 5,338,630 A | 8/1994 | Yoon et al. |
| 5,367,624 A | 11/1994 | Cooper |
| 5,375,064 A | 12/1994 | Bollinger |
| 5,398,336 A | 3/1995 | Tantry et al. |
| 5,402,367 A | 3/1995 | Sullivan et al. ............. 364/578 |
| 5,408,405 A | 4/1995 | Mozumder et al. ......... 364/151 |
| 5,410,473 A | 4/1995 | Kaneko et al. |
| 5,420,796 A * | 5/1995 | Weling et al. .............. 250/234 |
| 5,469,361 A | 11/1995 | Moyne |
| 5,485,082 A | 1/1996 | Wisspeintner et al. |
| 5,490,097 A | 2/1996 | Swenson et al. ............ 364/578 |
| 5,495,417 A | 2/1996 | Fuduka et al. |
| 5,497,316 A | 3/1996 | Sierk et al. |
| 5,497,381 A | 3/1996 | O'Donoghue et al. |
| 5,503,707 A | 4/1996 | Maung et al. |
| 5,508,947 A | 4/1996 | Sierk et al. |
| 5,511,005 A | 4/1996 | Abbe et al. |
| 5,519,605 A | 5/1996 | Cawlfield |
| 5,525,808 A | 6/1996 | Irie et al. |
| 5,526,293 A | 6/1996 | Mozumder et al. |
| 5,541,510 A | 7/1996 | Danielson |
| 5,546,312 A | 8/1996 | Mozumder et al. |
| 5,553,195 A | 9/1996 | Meijer |
| 5,586,039 A | 12/1996 | Hirsch et al. |
| 5,599,423 A | 2/1997 | Parker et al. |
| 5,602,492 A | 2/1997 | Cresswell et al. |
| 5,603,707 A | 2/1997 | Trombetta et al. |
| 5,617,023 A | 4/1997 | Skalski |
| 5,627,083 A | 5/1997 | Tounai |
| 5,629,216 A | 5/1997 | Wijaranakula et al. |
| 5,642,296 A | 6/1997 | Saxena |
| 5,646,870 A | 7/1997 | Krivokapic et al. |
| 5,649,169 A | 7/1997 | Berezin et al. |
| 5,654,903 A | 8/1997 | Reitman et al. |
| 5,655,951 A | 8/1997 | Meikle et al. |
| 5,657,254 A | 8/1997 | Sierk et al. |
| 5,661,669 A | 8/1997 | Mozumder et al. ......... 364/552 |
| 5,663,797 A | 9/1997 | Sandhu |
| 5,664,987 A | 9/1997 | Renteln |
| 5,665,199 A | 9/1997 | Sahota et al. |
| 5,666,297 A | 9/1997 | Britt et al. |
| 5,667,424 A | 9/1997 | Pan |
| 5,674,787 A | 10/1997 | Zhao et al. |
| 5,694,325 A | 12/1997 | Fukuda et al. |
| 5,698,989 A | 12/1997 | Nulman |
| 5,719,495 A | 2/1998 | Moslehi |
| 5,719,796 A | 2/1998 | Chen |
| 5,735,055 A | 4/1998 | Hochbein et al. |
| 5,740,429 A | 4/1998 | Wang et al. |
| 5,751,582 A | 5/1998 | Saxena et al. ......... 364/468.16 |
| 5,754,297 A | 5/1998 | Nulman |
| 5,761,064 A | 6/1998 | La et al. |
| 5,764,543 A | 6/1998 | Kennedy ..................... 364/578 |
| 5,777,901 A | 7/1998 | Berezin et al. |
| 5,787,021 A | 7/1998 | Samaha |
| 5,787,269 A | 7/1998 | Hyodo |
| 5,808,303 A | 9/1998 | Schlagheck et al. |
| 5,812,407 A | 9/1998 | Sato et al. |
| 5,823,854 A | 10/1998 | Chen |
| 5,825,913 A | 10/1998 | Rostami et al. |
| 5,828,778 A | 10/1998 | Hagi et al. |
| 5,832,224 A | 11/1998 | Fehskens et al. |
| 5,838,595 A | 11/1998 | Sullivan et al. |
| 5,844,554 A | 12/1998 | Geller et al. |
| 5,857,258 A | 1/1999 | Penzes et al. |
| 5,859,964 A | 1/1999 | Wang et al. |
| 5,859,975 A | 1/1999 | Brewer et al. |
| 5,863,807 A | 1/1999 | Jang et al. |
| 5,870,306 A | 2/1999 | Harada |
| 5,883,437 A | 3/1999 | Maruyama et al. |
| 5,889,991 A | 3/1999 | Consolatti et al. |
| 5,903,455 A | 5/1999 | Sharpe, Jr. et al. |
| 5,910,011 A | 6/1999 | Cruse |
| 5,910,846 A | 6/1999 | Sandhu |
| 5,916,016 A * | 6/1999 | Bothra ....................... 451/289 |
| 5,923,553 A | 7/1999 | Yi |
| 5,930,138 A | 7/1999 | Lin et al. |
| 5,940,300 A | 8/1999 | Ozaki |
| 5,943,237 A | 8/1999 | Van Boxem |
| 5,960,185 A | 9/1999 | Nguyen |
| 5,960,214 A | 9/1999 | Sharpe, Jr. et al. |
| 5,961,369 A | 10/1999 | Bartels et al. |
| 5,963,881 A | 10/1999 | Kahn et al. |
| 5,978,751 A | 11/1999 | Pence et al. |
| 5,982,920 A | 11/1999 | Tobin, Jr. et al. |
| 6,017,771 A | 1/2000 | Yang et al. |
| 6,036,349 A | 3/2000 | Gombar |
| 6,041,270 A * | 3/2000 | Steffan et al. ................. 438/14 |
| 6,054,379 A | 4/2000 | Yau et al. |
| 6,064,759 A | 5/2000 | Buckley et al. |
| 6,072,313 A | 6/2000 | Li et al. |
| 6,078,845 A * | 6/2000 | Friedman ..................... 438/166 |
| 6,097,887 A | 8/2000 | Hardikar et al. |
| 6,108,092 A | 8/2000 | Sandhu |
| 6,112,130 A | 8/2000 | Fukuda et al. |
| 6,127,263 A | 10/2000 | Parikh |
| 6,136,163 A | 10/2000 | Cheung et al. |
| 6,141,660 A | 10/2000 | Bach et al. |
| 6,143,646 A | 11/2000 | Wetzel |
| 6,148,099 A | 11/2000 | Lee et al. |
| 6,148,239 A | 11/2000 | Funk et al. |
| 6,148,246 A * | 11/2000 | Kawazome .................. 700/106 |
| 6,159,075 A | 12/2000 | Zhang |
| 6,159,644 A | 12/2000 | Satoh et al. |
| 6,161,054 A | 12/2000 | Rosenthal et al. |
| 6,169,931 B1 | 1/2001 | Runnels |
| 6,172,756 B1 | 1/2001 | Chalmers et al. |
| 6,173,240 B1 | 1/2001 | Sepulveda et al. |
| 6,175,777 B1 * | 1/2001 | Kim ........................... 700/121 |
| 6,178,390 B1 * | 1/2001 | Jun .............................. 438/16 |
| 6,183,345 B1 | 2/2001 | Kamono et al. |
| 6,185,324 B1 | 2/2001 | Ishihara et al. |
| 6,191,864 B1 | 2/2001 | Sandhu |
| 6,192,291 B1 * | 2/2001 | Kwon ......................... 118/663 |
| 6,197,604 B1 * | 3/2001 | Miller et al. ................... 438/14 |
| 6,204,165 B1 | 3/2001 | Ghoshal |
| 6,210,983 B1 | 4/2001 | Atchison et al. |
| 6,211,094 B1 | 4/2001 | Jun et al. |
| 6,214,734 B1 | 4/2001 | Bothra et al. |
| 6,217,412 B1 | 4/2001 | Campbell et al. |
| 6,222,936 B1 | 4/2001 | Phan et al. |

| | | | | | |
|---|---|---|---|---|---|
| 6,226,792 B1 | 5/2001 | Goiffon et al. | | | |
| 6,230,069 B1 * | 5/2001 | Campbell et al. ............ 700/121 | | | |
| 6,236,903 B1 * | 5/2001 | Kim et al. .................. 414/936 | | | |
| 6,240,330 B1 * | 5/2001 | Kurtzberg et al. .......... 700/105 | | | |
| 6,240,331 B1 | 5/2001 | Yun | | | |
| 6,246,972 B1 | 6/2001 | Klimasauskas | | | |
| 6,248,602 B1 | 6/2001 | Bode et al. | | | |
| 6,252,412 B1 | 6/2001 | Talbot et al. | | | |
| 6,253,366 B1 | 6/2001 | Mutschler, III | | | |
| 6,263,255 B1 | 7/2001 | Tan et al. | | | |
| 6,276,989 B1 | 8/2001 | Campbell et al. | | | |
| 6,280,289 B1 | 8/2001 | Wiswesser et al. | | | |
| 6,284,622 B1 | 9/2001 | Campbell et al. | | | |
| 6,287,879 B1 | 9/2001 | Gonzales et al. | | | |
| 6,290,572 B1 | 9/2001 | Hofmann | | | |
| 6,292,708 B1 * | 9/2001 | Allen et al. ............. 318/568.11 | | | |
| 6,298,274 B1 * | 10/2001 | Inoue ........................ 700/112 | | | |
| 6,298,470 B1 * | 10/2001 | Breiner et al. ................. 716/4 | | | |
| 6,303,395 B1 | 10/2001 | Nulman | | | |
| 6,304,999 B1 | 10/2001 | Toprac et al. | | | |
| 6,307,628 B1 | 10/2001 | Lu et al. | | | |
| 6,314,379 B1 | 11/2001 | Hu et al. | | | |
| 6,320,655 B1 | 11/2001 | Matsushita et al. | | | |
| 6,324,481 B1 | 11/2001 | Atchison et al. | | | |
| 6,334,807 B1 | 1/2002 | Lebel et al. | | | |
| 6,336,841 B1 | 1/2002 | Chang | | | |
| 6,345,315 B1 | 2/2002 | Mishra | | | |
| 6,360,133 B1 | 3/2002 | Campbell et al. | | | |
| 6,360,184 B1 | 3/2002 | Jacquez | | | |
| 6,366,934 B1 | 4/2002 | Cheng et al. | | | |
| 6,368,883 B1 | 4/2002 | Bode et al. | | | |
| 6,368,884 B1 | 4/2002 | Goodwin et al. | | | |
| 6,379,980 B1 | 4/2002 | Toprac | | | |
| 6,388,253 B1 | 5/2002 | Su | | | |
| 6,389,491 B1 | 5/2002 | Jacobson et al. | | | |
| 6,395,152 B1 | 5/2002 | Wang | | | |
| 6,397,114 B1 | 5/2002 | Eryurek et al. | | | |
| 6,405,096 B1 | 6/2002 | Toprac et al. | | | |
| 6,405,144 B1 | 6/2002 | Toprac et al. | | | |
| 6,435,952 B1 | 8/2002 | Boyd et al. | | | |
| 6,438,438 B1 | 8/2002 | Takagi et al. | | | |
| 6,440,295 B1 | 8/2002 | Wang | | | |
| 6,455,937 B1 | 9/2002 | Cunningham | | | |
| 6,479,902 B1 | 11/2002 | Lopatin et al. | | | |
| 6,479,990 B2 | 11/2002 | Mednikov et al. | | | |
| 6,503,839 B2 | 1/2003 | Gonzales et al. | | | |
| 6,517,413 B1 | 2/2003 | Hu et al. | | | |
| 2001/0001755 A1 | 5/2001 | Sandhu et al. | | | |
| 2001/0003084 A1 | 6/2001 | Finarov | | | |
| 2001/0030366 A1 | 10/2001 | Nakano et al. | | | |
| 2001/0039462 A1 | 11/2001 | Mendez et al. | | | |
| 2001/0042690 A1 | 11/2001 | Talieh | | | |
| 2002/0032499 A1 | 3/2002 | Wilson et al. | | | |
| 2002/0058460 A1 | 5/2002 | Lee et al. | | | |
| 2002/0070126 A1 | 6/2002 | Sato et al. | | | |
| 2002/0081951 A1 | 6/2002 | Boyd et al. | | | |
| 2002/0089676 A1 | 7/2002 | Pecen et al. | | | |
| 2002/0102853 A1 | 8/2002 | Li et al. | | | |
| 2002/0107599 A1 | 8/2002 | Patel et al. | | | |
| 2002/0113039 A1 | 8/2002 | Mok et al. | | | |
| 2002/0127950 A1 | 9/2002 | Hirose et al. | | | |
| 2002/0149359 A1 | 10/2002 | Crouzen et al. | | | |
| 2002/0185658 A1 | 12/2002 | Inoue et al. | | | |
| 2002/0193902 A1 | 12/2002 | Shanmugasundram et al. | | | |
| 2002/0197745 A1 | 12/2002 | Shanmugasundram et al. | | | |
| 2002/0197934 A1 | 12/2002 | Paik | | | |
| 2002/0199082 A1 | 12/2002 | Shanmugasundram et al. | | | |
| 2003/0020909 A1 | 1/2003 | Adams et al. | | | |
| 2003/0020928 A1 | 1/2003 | Ritzdorf et al. | | | |

FOREIGN PATENT DOCUMENTS

| | | |
|---|---|---|
| EP | 0 621 522 a2 | 10/1994 |
| EP | 0 747 795 A2 | 12/1996 |
| EP | 0 869 652 | 10/1998 |
| EP | 0877308 | 11/1998 |
| EP | 0 881 040 A2 | 12/1998 |
| EP | 0 895 145 A1 | 2/1999 |
| EP | 0 910 123 | 4/1999 |
| EP | 0 932 194 | 7/1999 |
| EP | 1 066 925 A2 | 1/2001 |
| EP | 1 071 128 | 1/2001 |
| EP | 1 092 505 A2 | 4/2001 |
| EP | 1072967 A3 | 11/2001 |
| EP | 1 182 526 A2 | 2/2002 |
| GB | 2 347 885 A | 9/2000 |
| JP | 61-66104 | 4/1986 |
| JP | 61-171147 | 8/1986 |
| JP | 283934 | 11/1989 |
| JP | 3-202710 | 9/1991 |
| JP | 05-151231 | 6/1993 |
| JP | 05-216896 | 8/1993 |
| JP | 05-266029 | 10/1993 |
| JP | 06-110894 | 4/1994 |
| JP | 06-176994 | 6/1994 |
| JP | 6-184434 | 7/1994 |
| JP | 06-252236 | 9/1994 |
| JP | 06-260380 | 9/1994 |
| JP | 8-23166 | 1/1996 |
| JP | 8-50161 | 2/1996 |
| JP | 149583 | 6/1996 |
| JP | 8-304023 | 11/1996 |
| JP | 34535 | 2/1997 |
| JP | 9-246547 | 9/1997 |
| JP | 10-34522 | 2/1998 |
| JP | 10-173029 | 6/1998 |
| JP | 67853 | 3/1999 |
| JP | 11-126816 | 5/1999 |
| JP | 11-135601 | 5/1999 |
| JP | 2000-183001 | 6/2000 |
| JP | 2001-76982 | 3/2001 |
| JP | 2001-284299 | 10/2001 |
| JP | 2001-305108 | 10/2001 |
| JP | 2002-9030 | 1/2002 |
| JP | 2002-343754 | 11/2002 |
| TW | 434103 | 5/2001 |
| TW | 436383 | 5/2001 |
| TW | 455938 | 9/2001 |
| TW | 455976 | 9/2001 |
| WO | WO 95/34866 | 12/1995 |
| WO | WO 98/05066 | 2/1998 |
| WO | WO 98/45090 | 10/1998 |
| WO | WO 99/09371 | 2/1999 |
| WO | WO 99/25520 | 5/1999 |
| WO | WO 00/00874 | 1/2000 |
| WO | WO 00/05759 | 2/2000 |
| WO | WO 00/35063 | 6/2000 |
| WO | WO 00/54325 | 9/2000 |
| WO | WO 00/79355 A1 | 12/2000 |
| WO | WO 01/15865 A1 | 3/2001 |
| WO | WO 01/18623 | 3/2001 |
| WO | WO 01/25865 | 4/2001 |
| WO | WO 01/52055 A3 | 7/2001 |
| WO | WO 01/57823 A2 | 8/2001 |
| WO | WO 02/17150 A1 | 2/2002 |
| WO | WO 02/33737 A2 | 4/2002 |
| WO | WO 02/074491 | 9/2002 |

OTHER PUBLICATIONS

Suzuki, Junichi and Yoshikazu Yamamoto. 1998. "Toward the Interoperable Software Design Models: Quartet of UML, XML, DOM and CORBA." Proceedings IEEE International Software Engineering Standards Symposium. pp. 1–10.

Klein, Bruce. Jun. 1999. "Application Development: XML Makes Object Models More Useful." Informationweek. pp. 1A–6A.

Chemali, Chadi El, James Moyne, Kareemullah Khan, Rock Nadeau, Paul Smith, John Colt, Jonathan Chapple–Sokol, and Tarun Parikh. Jul./Aug. 2000. "Multizone Uniformity Control of a Chemical Mechanical Polishing Process Utilizing a Pre– and Postmeasurement Strategy." J. Vac. Sci. Technol. A, vol. 18(4). pp. 1287–1296. American Vacuum Society.

Jensen, Alan, Peter Renteln, Stephen Jew, Chris Raeder, and Patrick Cheung. Jun. 2001. "Empirical–Based Modeling for Control of CMP Removal Uniformity." Solid State Technology, vol. 44, No. 6, pp. 101–102, 104, 106. Cowan Publ. Corp.: Washington, D.C.

Sarfaty, Moshe, Arulkumar Shanmugasundram, Alexander Schwarm, Joseph Paik, Jimin Zhang, Rong Pan, Martin J. Seamons, Howard Li, Raymond Hung, and Suketu Parikh. Apr./May 2002. "Advance Process Control Solutions for Semiconductor Manufacturing." IEEE/SEMI Advanced Semiconductor Manufacturing Conference. pp. 101–106.

Oct. 4, 2002. International Search Report from PCT/US01/22833.

Oct. 23, 2002. International Search Report from PCT/US01/27406.

Nov. 7, 2002. International Search Report from PCT/US02/19061.

Nov. 11, 2002. International Search Report from PCT/US02/19117.

Nov. 12, 2002. International Search Report from PCT/US02/19063.

Feb. 1984. "Method and Apparatus of in Situ Measurement and Overlay Error Analysis for Correcting Step and Repeat Lithographic Cameras." *IBM Technical Disclosure Bulletin*, pp. 4855–4859.

Oct. 1984. "Method to Characterize the Stability of a Step and Repeat Lithographic System." *IBM Technical Disclosure Bulletin*, pp. 2857–2860.

Schmid, Hans Albrecht. 1995. "Creating the Architecture of a Manufacturing Framework by Design Patterns." Austin, Texas: OOPSLA.

Baliga, John. Jul. 1999. "Advanced Process Control: Soon to be a Must." Cahners Semiconductor International. www.semiconductor.net/semiconductor/issues/issues/1999/jul99/docs/feature1.asp.

Jul. 5, 2001. "Motorola and Advanced Micro Devices Buy ObjectSpace Catalyst Advanced Process Control Product for Five Wafer Fabs." Semiconductor FABTECH. www.semiconductorfabtech.com/industry.news/9907/20.07.shtml.

Oct. 15, 2001. Search Report prepared by the Austrian Patent Office for Singapore Patent Application No. 200004286–1.

Johnson, Bob. Jun. 10, 2002. "Advanced Process Control Key to Moore's Law." Gartner, Inc.

Jul. 9, 2002. International Search Report prepared by the European Patent Office for PCT/US01/24910.

Jul. 29, 2002. International Search Report prepared by the European Patent Office for PCT/US01/27407.

Sonderman, Thomas. 2002. "APC as a Competitive Manufacturing Technology: *AMD's Vision for 300mm*." AEC/APC.

Oct. 15, 2002. International Search Report prepared by the European Patent Office for PCT/US02/19062.

Communication Pursuant to Article 96(2) EPC for European Patent Application No. 00 115 577.9. Jul. 23, 2002.

Zhou, Zhen–Hong and Rafael Reif. Aug. 1995. "Epi–Film Thickness Measurements Using Emission Fourier Transform Infrared Spectroscopy—Part II: Real–Time in Situ Process Monitoring and Control." IEEE Transactions on Semiconductor Manufacturing, vol. 8, No. 3.

Telfeyan, Roland, James Moyne, Nauman Chaudhry, James Pugmire, Scott Shellman, Duane Boning, William Moyne, Arnon Hurwitz, and John Taylor. Oct. 1995. "A Multi–Level Approach to the Control of a Chemical–Mechanical Planarization Process." Minneapolis, Minnesota: $42^{nd}$ National Symposium of the American Vacuum Society.

Chang, E., B. Stine, T. Maung, R. Divecha, D. Boning, J. Chung, K. Chang, G. Ray, D. Bradbury, O. S. Nakagawa, S. Oh, and D. Bartelink. Dec. 1995. "Using a Statistical Metrology Framework to Identify Systematic and Random Sources of Die– and Wafer–level ILD Thickness Variation in CMP Processes." Washington, D.C.: International Electron Devices Meeting.

Smith, Taber, Duane Boning, James Moyne, Arnon Hurwitz, and John Curry. Jun. 1996. "Compensating for CMP Pad Wear Using Run by Run Feedback Control." Santa Clara, California: VLSI Multilevel Interconnect Conference.

Boning, Duane, William Moyne, Taber Smith, James Moyne, Roland Telfeyan, Arnon Hurwitz, Scott Shellman, and John Taylor. Oct. 1996. "Run by Run Control of Chemical–Mechanical Polishing." *IEEE Trans. CPMT (C)*, vol. 19, No. 4, pp. 307–314.

Edgar, Thomas F., Stephanie W. Butler, Jarrett Campbell, Carlos Pfeiffer, Chris Bode, Sung Bo Hwang, and K.S. Balakrishnan. May 1998. "Automatic Control in Microelectronics Manufacturing: Practices, Challenges, and Possibilities." Automatica, vol. 36, pp. 1567–1603, 2000.

Chemali, Chadi El, James Moyne, Kareemullah Khan, Rock Nadeau, Paul Smith, John Colt, Jonathan Chapple–Sokol, and Tarun Parikh. Nov. 1998. "Multizone Uniformity Control of a CMP Process Utilizing a Pre and Post–Measurement Strategy." Seattle, Washington: SEMETECH Symposium.

Moyne, James. Oct. 1999. "Advancements in CMP Process Automation and Control." Hawaii: (Invited paper and presentation to) Third International Symposium on Chemical Mechanical Polishing in IC Device Manufacturing: $196^{th}$ Meeting of the Electrochemical Society.

Lee, Brian, Duane S. Boning, Winthrop Baylies, Noel Poduje, Pat Hester, Yong Xia, John Valley, Chris Koliopoulus, Dale Hetherington, HongJiang Sun, and Michael Lacy. Apr. 2001. "Wafer Nanotopography Effects on CMP: Experimental Validation of Modeling Methods." San Francisco, California: Materials Research Society Spring Meeting.

NovaScan 2020. Feb. 2002. "Superior Integrated Process Control for Emerging CMP High–End Applications.".

SEMI. 2000. "Provisional Specification for CIM Framework Scheduling Component." San Jose, California. SEMI E105–1000.

G. Dishon, D. Eylon, M. Finarov and A. Shulman, "Dielectric CMP Advanced Process Control Based on Integrated Monitoring", Nova Measuring Instruments, Ltd., Rehoveth, Israel.

James R. Moyne, Nauman Chaudhry, and Roland Telfeyan, "Adaptive Extensions to a Multi–Branch Run–to–Run Controller for Plasma Etching", University of Michigan, Journal of Vacuum Science and Techonology, 1995.

Ostanin, Yu.Ya. Oct. 1981. "Optimization of Thickness Inspection of Electrically Conductive Single–Layer Coatings with Laid–on Eddy–Current Transducers (Abstract)." *Defektoskopiya*, vol. 17, No. 10, pp. 45–52. Moscow, USSR.

Feb. 1984. "Substrate Screening Process." *IBM Technical Disclosure Bulletin*, pp. 4824–4825.

Herrmann, D. 1988. "Temperature Errors and Ways of Elimination for Contactless Measurement of Shaft Vibrations (Abstract)." *Technisches Messen™*, vol. 55, No. 1, pp. 27–30. West Germany.

Lin, Kuang–Kuo and Costas J. Spanos. Nov. 1990. "Statistical Equipment Modeling for VLSI Manufacturing: An Application for LPCVD." *IEEE Transactions on Semiconductor Manufacturing*, v. 3, n. 4, pp. 216–229.

Chang, Norman H. and Costas J. Spanos. Feb. 1991. "Continuous Equipment Diagnosis Using Evidence Integration: An LPCVD Application." *IEEE Transactions on Semiconductor Manufacturing*, v. 4, n. 1, pp. 43–51.

Larrabee, G. B. May 1991. "The Intelligent Microelectronics Factory of the Future (Abstract)." *IEEE/SEMI International Semiconductor Manufacturing Science Symposium*, pp. 30–34, Burlingame, CA.

Burke, Peter A. Jun. 1991. "Semi–Empirical Modelling of SiO2 Chemical–Mechanical Polishing Planarization." *VMIC Conference, 1991 IEEE*, pp. 379–384. IEEE.

May 1992. "Laser Ablation Endpoint Detector." *IBM Technical Disclosure Bulletin*, pp. 333–334.

Spanos, Costas J., Hai–Fang Guo, Alan Miller, and Joanne Levine–Parrill. Nov. 1992. "Real–Time Statistical Process Control Using Tool Data." *IEEE Transactions on Semiconductor Manufacturing*, v. 5, n. 4, pp. 308–318.

Feb. 1993. "Electroless Plating Scheme to Hermetically Seal Copper Features." *IBM Technical Disclosure Bulletin*, pp. 405–406.

Scarr, J. M. and J. K. Zelisse. Apr. 1993. "New Topology for Thickness Monitoring Eddy Current Sensors (Abstract)." *Proceedings of the 36th Annual Technical Conference*, Dallas, Texas.

Matsuyama, Akira and Jessi Niou. 1993. "A State–of–the–Art Automation System of an ASIC Wafer Fab in Japan." *IEEE/SEMI International Semiconductor Manufacturing Science Syposium*, pp. 42–47.

Yeh, C. Eugene, John C. Cheng, and Kwan Wong. 1993. "Implementation Challenges of a Feedback Control System for Wafer Fabrication." *IEEE/CHMT International Electronics Manufacturing Technology Symposium*, pp. 438–442.

Kurtzberg, Jerome M. and Menachem Levanoni. Jan. 1994. "ABC: A Better Control for Manufacturing." *IBM Journal of Research and Development*, v. 38, n. 1, pp. 11–30.

Mozumder, Purnendu K. and Gabriel G. Barna. Feb. 1994. "Statistical Feedback Control of a Plasma Etch Process." *IEEE Transactions on Semiconductor Manufacturing*, v. 7, n. 1, pp. 1–11.

Muller–Heinzerling, Thomas, Ulrich Neu, Hans Georg Nurnberg, and Wolfgang May. Mar. 1994. "Recipe–Controlled Operation of Batch Processes with Batch X." *ATP Automatisierungstechnische Praxis*, vol. 36, No. 3, pp. 43–51.

Stoddard, K., P. Crouch, M.Kozicki, and K. Tsakalis. JunJul. 1994. "Application of Feedforward and Adaptive Feedback Control to Semiconductor Device Manufacturing (Abstract)." *Proceedings of 1994 American Control Conference—ACC '94*, vol. 1, pp. 892–896. Baltimore, Maryland.

Schaper, C. D., M. M. Moslehi, K. C. Saraswat, and T. Kailath. Nov. 1994. "Modeling, Identification, and Control of Rapid Thermal Processing Systems (Abstract)." *Journal of the Electrochemical Society*, vol. 141, No. 11, pp. 3200–3209.

Tao, K. M., R. L. Kosut, M. Ekblad, and G. Aral. Dec. 1994. "Feedforward Learning Applied to RTP of Semiconductor Wafers (Abstract)." *Proceedings of the 33rd IEEE Conference and Decision and Control*, vol. 1, pp. 67–72. Lake Buena Vista, Florida.

Hu, Albert, He Du, Steve Wong, Peter Renteln, and Emmanuel Sachs. 1994. "Application of Run by Run Controller to the Chemical–Mechanical Planarization Process." *IEEE/CPMT International Electronics Manufacturing Technology Symposium*, pp. 371–378.

Spanos, C. J., S. Leang, S.–Y. Ma, J. Thomson, B. Bombay, and X. Niu. May 1995. "A Multistep Supervisory Controller for Photolithographic Operations (Abstract)." *Proceedings of the Symposium on Process Control, Diagnostics, and Modeling in Semiconductor Manufacturing*, pp. 3–17.

Leang, Sovarong, Shang–Yi Ma, John Thomson, Bart John Bombay, and Costas J. Spanos. May 1996. "A Control System for Photolithographic Sequences." *IEEE Transactions on Semiconductor Manufacturing*, vol. 9, No. 2.

Boning, Duane S., William P. Moyne, Taber H. Smith, James Moyne, Ronald Telfeyan, Arnon Hurwitz, Scott Shellman, and John Taylor. Oct. 1996. "Run by Run Control of Chemical–Mechanical Polishing." *IEEE Transactions on Components, Packaging, and Manufacturing Technology—Part C*, vol. 19, No. 4, pp. 307–314.

Zhe, Ning, J. R. Moyne, T. Smith, D. Boning, E. Del Castillo, Yeh Jinn–Yi, and Hurwitz. Nov. 1996. "A Comparative Analysis of Run–to–Run Control Algorithms in Semiconductor Manufacturing Industry (Abstract)." *IEEE/SEMI 1996 Advanced Semiconductor Manufacturing Conference Workshop*, pp. 375–381.

Yasuda, M., T. Osaka, and M. Ikeda. Dec. 1996. "Feedforward Control of a Vibration Isolation System for Disturbance Suppression (Abstract)." *Proceeding of the 35th IEEE Conference on Decision and Control*, vol. 2, pp. 1229–1233. Kobe, Japan.

Fan, Jr–Min, Ruey–Shan Guo, Shi–Chung Chang, and Kian-Huei Lee. 1996. "Abnormal Tred Detection of SequenceDisordered Data Using EWMA Method." *IEEE/SEMI Advanced Semiconductor Manufacturing Conference*, pp. 169–174.

Smith, Taber and Duane Boning. 1996. "A Self–Tuning EWMA Controller Utilizing Artificial Neural Network Function Approximation Techniques." *IEEE/CPMT International Electronics Manufacturing Technology Symposium*, pp. 355–363.

Guo, Ruey–Shan, Li–Shia Huang, Argon Chen, and JinJung Chem. Oct. 1997. "A Cost–Effective Methodology for a Run–by–Run EWMA Controller." *6th International Symposium on Semiconductor Manufacturing*, pp. 61–64.

Mullins, J. A., W. J. Campbell, and A. D. Stock. Oct. 1997. "An Evaluation of Model Predictive Control in Run–to–Run Processing in Semiconductor Manufacturing (Abstract)." *Proceedings of the SPIE—The International Society for Optical Engineering Conference*, vol. 3213, pp. 182–189.

Reitman, E. A., D. J. Friedman, and E. R. Lory. Nov. 1997. "Pre–Production Results Demonstrating Multiple–System Models for Yield Analysis (Abstract)." *IEEE Transactions on Semiconductor Manufacturing*, vol. 10, No. 4, pp. 469–481.

Durham, Jim and Myriam Roussel. 1997. "A Statistical Method for Correlating In–Line Defectivity to Probe Yield." *IEEE/SEMI Advanced Semiconductor Manufacturing Conference*, pp. 76–77.

Shindo, Wataru, Eric H. Wang, Ram Akella, and Andrzej J. Strojwas. 1997. "Excursion Detection and Source Isolation in Defect Inspection and Classification." *2nd International Workshop on Statistical Metrology*, pp. 90–93.

Jul. 1998. "Active Controller: Utilizing Active Databases for Implementing Multistep Control of Semiconductor Manufacturing (Abstract)." *IEEE Transactions on Components, Packaging and Manufacturing Technology—Part C*, vol. 21, No. 3, pp. 217–224.

Fang, S. J., A. Barda, T. Janecko, W. Little, D. Outley, G. Hempel, S. Joshi, B. Morrison, G. B. Shinn, and M. Birang. 1998. "Control of Dielectric Chemical Mechanical Polishing (CMP) Using and Interferometry Based Endpoint Sensor." *International Proceedings of the IEEE Interconnect Technology Conference*, pp. 76–78.

Ouma, Dennis, Duane Boning, James Chung, Greg Shinn, Leif Olsen, and John Clark. 1998. "An Integrated Characterization and Modeling Methodology for CMP Dielectric Planarization." *Proceedings of the IEEE 1998 International Interconnect Technology Conference*, pp. 67–69.

Boning, Duane S., Jerry Stefani, and Stephanie W. Butler. Feb. 1999. "Statistical Methods for Semiconductor Manufacturing." *Encyclopedia of Electrical Engineering*, J. G. Webster, Ed.

McIntosh, John. Mar. 1999. "Using CD–SEM Metrology in the Manufacture of Semiconductors (Abstract)." *JOM*, vol. 51, No. 3, pp. 38–39.

Pan, J. Tony, Ping Li, Kapila Wijekoon, Stan Tsai, and Fritz Redeker. May 1999. "Copper CMP Integration and Time Dependent Pattern Effect." *IEEE 1999 International Interconnect Technology Conference*, pp. 164–166.

Meckl, P. H. and K. Umemoto. Aug. 1999. "Achieving Fast Motions in Semiconductor Manufacturing Machinery (Abstract)." *Proceedings of the 1999 IEEE International Conference on Control Applications*, vol. 1, pp. 725–729. Kohala Coast, HI.

Khan, K., C. El Chemali, J. Moyne, J. Chapple–Sokol, R. Nadeau, P. Smith., C., and T. Parikh. Oct. 1999. "Yield Improvement at the Contact Process Through Run–to–Run Control (Abstract)." *24th IEEE/CPMT Electronics Manufacturing Technology Symposium*, pp. 258–263.

Ruegsegger, Steven, Aaron Wagner, James S. Freudenberg, and Dennis S. Grimard. Nov. 1999. "Feedforward Control for Reduced Run–to–Run Variation in Microelectronics Manufacturing." *IEEE Transactions on Semiconductor Manufacturing*, vol. 12, No. 4.

Nov. 1999. "How to Use EWMA to Achieve SPC and EPC Control." *International Symposium on NDT Contribution to the Infrastructure Safety Systems*, Tores, Brazil. <http://www.ndt.net/abstract/ndtiss99/data/35.htm>.

Edgar, T. F., W. J. Campbell, and C. Bode. Dec. 1999. "Model–Based Control in Microelectronics Manufacturing." *Proceedings of the 38th IEEE Conference on Decision and Control*, Phoenix, Arizona, vol. 4, pp. 4185–4191.

Meckl, P. H. and K. Umemoto. Apr. 2000. "Achieving Fast Motions by Using Shaped Reference Inputs [Semiconductor Manufacturing Machine] (Abstract)." *NEC Research and Development*, vol. 41, No. 2, pp. 232–237.

Oechsner, R., T. Tschaftary, S. Sommer, L. Pfitzner, H. Ryssel, H. Gerath, C. Baier, and M. Hafner. Sep. 2000. "Feed–forward Control for a Lithography/Etch Sequence (Abstract)." *Proceedings of the SPIE—The International Society for Optical Engineering Conference*, vol. 4182, pp. 31–39.

Cheung, Robin. Oct. 18, 2000. "Copper Interconnect Technology." *AVS/CMP User Group Meeting*, Santa Clara, CA.

Edgar, Thomas F., Stephanie W. Butler, W. Jarrett Campbell, Carlos Pfeiffer, Christopher Bode, Sung Bo Hwang, K. S. Balakrishnan, and J. Hahn. Nov. 2000. "Automatic Control in Microelectronics Manufacturing: Practices, Challenges, and Possibilities (Abstract)." *Automatica*, v. 36, n. 11.

Khan, S., M. Musavi, and H. Ressom. Nov. 2000. "Critical Dimension Control in Semiconductor Manufacturing (Abstract)." *ANNIE 2000. Smart Engineering Systems Design Conference*, pp. 995–1000. St. Louis, Missouri.

ACM Research Inc. 2000. "Advanced Copper Metallization for 0.13 to 0.05 $\mu$m & Beyond." <http://acmrc.com/press/ACM–ECP–brochure.pdf>.

Ravid, Avi, Avner Sharon, Amit Weingarten, Vladimir Machavariani, and David Scheiner. 2000. "Copper CMP Planarity Control Using ITM." *IEEE/SEMI Advanced Semiconductor Manufacturing Conference*, pp. 437–443.

Chen, Argon and Ruey–Shan Guo. Feb. 2001. "Age–Based Double EWMA Controller and Its Application to CMP Processes." *IEEE Transactions on Semiconductor Manufacturing*, vol. 14, No. 1, pp. 11–19.

Tobin, K. W., T. P. Karnowski, L. F. Arrowood, and F. Lakhani. Apr. 2001. "Field Test Results of an Automated Image Retrieval System (Abstract)." *Advanced Semiconductor Manufacturing Conference, 2001 IEEE/SEMI*, Munich, Germany.

Tan, K. K., H. F. Dou, and K. Z. Tang. May–Jun. 2001. "Precision Motion Control System for Ultra–Precision Semiconductor and Electronic Components Manufacturing (Abstract)." *51st Electronic Components and Technology Conference 2001. Proceedings*, pp. 1372–1379. Orlando, Florida.

Heuberger, U. Sep. 2001. "Coating Thickness Measurement with Dual–Function Eddy–Current & Magnetic Inductance Instrument (Abstract)." *Galvanotechnik*, vol. 92, No. 9, pp. 2354–2366+IV.

Wang, LiRen and Hefin Rowlands. 2001. "A Novel NN–Fuzzy–SPC Feedback Control System." *8th IEEE International Conference on Emerging Technologies and Factory Automation*, pp. 417–423.

Moyne, J., V. Solakhian, A. Yershov, M. Anderson, and D. Mockler–Hebert. Apr.–May 2002. "Development and Deployment of a Multi–Component Advanced Process Control System for an Epitaxy Tool (Abstract)." *2002 IEEE Advanced Semiconductor Manufacturing Conference and Workshop*, pp. 125–130.

Sarfaty, M., A. Shanmugasundram, A. Schwarm, J. Paik, Jimin Zhang, Rong Pan, M. J. Seamons, H. Li, R. Hung, and S. Parikh. Apr.–May 2002. "Advance Process Control Solutions for Semiconductor Manufacturing (Abstract)." *13th Annual IEEE/SEMI Advanced Semiconductor Manufacturing Conference. Advancing the Science and Technology of Semiconductor Manufacturing. ASMC 2002*, pp. 101–106. Boston, MA.

Campbell, W. J., S. K. Firth, A. J. Toprac, and T. F. Edgar. May 2002. "A Comparison of Run–to–Run Control Algorithms (Abstract)." *Proceedings of 2002 American Control Conference*, vol. 3, pp. 2150–2155.

Good, Richard and S. Joe Qin. May 2002. "Stability Analysis of Double EWMA Run–to–Run Control with Metrology Delay." *IEEE/CPMT International Electronics Manufacturing Technology Symposium*, pp. 355–363.

Smith, Stewart, Anthony J. Walton, Alan W. S. Ross, Georg K. H. Bodammer, J. T. M. Stevenson. May 2002. "Evaluation of Sheet Resistance and Electrical Linewidth Measurement Techniques for Copper Damascene Interconnect." *IEEE Transactions on Semiconductor Manufacturing*, vol. 15, No. 2, pp. 214–222.

Itabashi, Takeyuki, Hiroshi Nakano, and Haruo Akahoshi. Jun. 2002. "Electroless Deposited CoWB for Copper Diffusion Barrier Metal." *IEEE International Interconnect Technology Conference*, pp. 285–287.

ACM Research, Inc. 2002. "ACM Ultra ECP® System: Electro–Copper Plating (ECP) Deposition." www.acmrc.com/ecp.html.

Applied Materials, Inc. 2002. "Applied Materials: Information for Everyone: Copper Electrochemical Plating." www.appliedmaterials.com/products/copper_electrochemical_plating.html.

KLA–Tencor Corporation. 2000. "KLA Tencor: Press Release: KLA–Tencor Introduces First Production–Worthy Copper CMP In–Situ Film Thickness and End–point Control System: Multi–Million Dollar Order Shipped to Major CMP Tool Manufacturer." www.kla–tencor.com/news_events/press_releases/press_releases2001/984086002.html.

Takahashi, Shingo, Kaori Tai, Hiizu Ohtorii, Naoki Komai, Yuji Segawa, Hiroshi Horikoshi, Zenya Yasuda, Hiroshi Yamada, Masao Ishihara, and Takeshi Nogami. 2002. "Fragile Porous Low–k/Copper Integration by Using Electro–Chemical Polishing." *2002 Symposium on VLSI Technology Digest of Technical Papers*, pp. 32–33.

Cunningham, James A. 2003. "Using Electrochemistry to Improve Copper Interconnects." <http://www.e–insite.net/semiconductor/index.asp?layout=article&articleid=CA47465>.

Mar. 25, 2003. International Search Report for PCT/US02/24859 prepared by the European Patent Office.

Adams, Bret W., Bogdan Swedek, Rajeev Bajaj, Fritz Redeker, Manush Birang, and Gregory Amico. "Full–Wafer Endpoint Detection Improves Process Control in Copper CMP." *Semiconductor Fabtech*—12th Edition. Applied Materials, Inc., Santa Clara, CA.

Berman, Mike, Thomas Bibby, and Alan Smith. "Review of In Situ & In–line Detection for CMP Applications." *Semiconductor Fabtech*, 8th Edition, pp. 267–274.

"Semiconductor Manufacturing: An Overview." <http://users.ece.gatech.edu/~gmay/overview.html>.

Runyan, W. R., and K. E. Bean. 1990. *Semiconductor Integrated Circuit Processing Technology*. p. 48. Reading, Massachusetts: Addison–Wesley Publishing Company.

Zorich, Robert. 1991. *Handbook of Quality Integrated Circuit Manufacturing*. San Diego, California: Academic Press, Inc.

Rampalli, Prasad, Arakere Ramesh, and Nimish Shah. 1991. *CEPT—A Computer–Aided Manufacturing Application for Managing Eqipment Reliability and Availability in the Semiconductor Industry*. New York, New York: IEEE.

SEMI. [1986] 1996. *Standard for Definition and Measurement of Equipment Reliability, Availability, and Maintainability (RAM)*.

VAn Zant, Peter. 1997. *Microchip Fabrication: A Practical Guide to Semiconductor Processing*. New York, New York: McGraw–Hill.

Consilium. 1998. *Quality Management Component*. Mountain View, California: Consilium, Inc.

Consilium. 1998. *FAB300™*. Mountain View, California: Consilium, Inc.

SEMI. 1998. *New Standard: Provisional Specification for CIM Framework Domain Architecture*. Mountain View, California: SEMI Standards.

Consilium. 1999. FAB300™: Consilium's Next Generation MES Solution of Software and Services which Control and Automate Real–Time FAB Operations.

Consilium. 1999. *FAB300™ Update*.

James Moyne, Roland Telfeyan, Arnon Hurwitz, John Taylor, "A Process–Independent Run–to–Run Controller and Its Application to Chemical–Mechanical Planarization", The University of Michigan, Electrical Engineering & Computer Science Center for Display Technology & Manufacturing Ann Arbor, MI Aug. 15, 1995.

G. Dishon, M. Finarov, R. Kipper, J.W. Curry, T. Shraub, D. Trojan, 4th Stambaugh, Y. Li and J. Ben–Jacob, "On–Line Integrated Metrology for CMP Processing", VMIC Speciality Conferences, 1st International CMP Planarization Conference, Santa Clara, CA, Feb., 1996.

Kareemullah Khan, Victor Solakhain, Anthony Ricci, Tier Gu, and James Moyne, "Run–to–Run Control of ITO Deposition Process", Michigan, 1998.

W. Jarrett Campbell and Anthony J. Toprac, "Run–to–Run Control in Microelectronics Manufacturing", Advanced Micro Devises, TWMCC, Feb. 11–12, 1998.

James Moyne and John Curry, "A Fully Automated Chemical–Mechanical Planarization Process", Jun. 1998.

"Increasing Overall Equipment Effectiveness (OEE) in Fab Manufacturing by Implementing Consilium's Next–Generation Manufacturing Execution System—MES II", Semiconductor Fabtech Edition 10, Jul. 1999.

Consilium Corporate Brochure, Oct. 4, 1999.

\* cited by examiner

```
                    ┌─────────────────────────────────────────────┐
                    │  TOOL STATUS                       TOOL ID   │
                    ├─────────────────────────────────────────────┤
               1)   │  PRODUCT ID (READY FOR PRODUCTION)           │
```

|  | |
|---|---|
| 1) PRODUCT ID (READY FOR PRODUCTION) | |
| TIME TO MAINTENANCE | DAYS/HRS/SECS |
| NUMBER OF WAFERS BEFORE MAINTENANCE | WAFERS |
| 2) PRODUCT ID (DOWN FOR MAINTENANCE) | |
| TIME BEFORE UP FOR PRODUCTION | DAYS/HRS/SECS |
| 3) PRODUCT ID (CURRENTLY RUNNING) | |
| NUMBERS OF WAFERS BEFORE COMPLETION | WAFERS |
| TIME TO MAINTENANCE | DAYS/HRS/SECS |
| NUMBER OF WAFERS BEFORE MAINTENANCE | WAFERS |

THREE POSSIBLE STATES OF TOOL → 1), 2), 3)

FIG. 4a

DATA RECORD FOR TOOL STATUS

HOST                                                          TOOLS

1. TOOL STATUS REQUEST ──────▶
   (LIST OF PRODUCT ID FOR ONE TOOL OR CROSS ALL TOOLS)

2. TOOL STATUS ◀──────
   (LIST OF PRODUCT STATUS RECORD OF THE TOOL)

3. TOOL SERVICE REQUEST ──────▶
   (GIVEN LIST OF PRODUCT ID, OR TOOL ID)

4. TOOL SERVICE GRANTED OR REJECTED ◀──────

5. TOOL SERVICE STARTS ──────▶

6. TOOL SERVICE COMPLETED ◀──────

FIG. 4b

| WAFER INFORMATION | | | WAFER ID |
|---|---|---|---|

| TOOL ID | SEQUENCE | PARAMETERS | DATA LIST |
|---|---|---|---|
| STEP 1 | RECIPE 1 | PARAMETERS | DATA LIST |
| STEP 2 | RECIPE 2 | PARAMETERS | DATA LIST |
| ⋮ | ⋮ | | |
| ⋮ | ⋮ | | |
| STEP N | RECIPE N | PARAMETERS | DATA LIST |

FIG. 6

MULTI-TOOL CONTROL SYSTEM, METHOD AND MEDIUM

BACKGROUND OF THE INVENTION

1. Field of the Invention

The present invention relates to the control of tools and the communication among tools in a multi-tool semiconductor processing environment. More specifically, embodiments of the present invention relate to a system, method and medium for control of and communication among wafer processing tools in a wafer processing environment.

2. Related Art

In today's semiconductor manufacturing environment, a facility for the production of semiconductor products (such as, e.g., wafers) will typically contain multiple tools, each for performing one or more of a variety of functions. Thus, where a wafer is being processed into items such as logic (e.g., central processing units) or memory (e.g., DRAMs) units, each tool performs some specified function on the wafer, and then the wafer is passed on to the next tool. (The final product output, i.e., final state of the wafer, in this example, eventually gets cut up into individual chips, e.g., Central Processing Units, DRAM's, etc.)

An example of a conventional semiconductor manufacturing facility is now described with regard to FIG. 1. Referring now to FIG. 1, a host computer 104 is shown as being in communication and control of the various aspects of the semiconductor manufacturing facility. More specifically, host computer 104 is in communication with Tools 1–3 (112–116, respectively) used to process (or inspect) semiconductor products. Thus, for example, Tool 1 (112) might be a deposition tool, while Tool 2 (114) might be a chemical mechanical polishing (CMP) tool.

For each tool shown in FIG. 1, there exists an associated station controller (106–110). These station controllers are used to facilitate the communication between the tools (112–116) and the host computer 104. Since the tools often have disparate protocols, it becomes necessary to implement the station controllers (106–110) to allow the tools to communicate using protocol common to the semiconductor processing facility, and thus communicate with the host computer 104. Such common protocols that may be used to ultimately communicate with the host computer 104 include SECS/GEM and HSMS.

In addition, host computer 104 is also in communication with a material transport control 102, which controls an external material transport system 118. The external material transport system 118 is what physically transports the semiconductor products (at their various stages of production) from one tool to another. (Typically, the semiconductor products are contained in cassettes, boxes or pods of 25 units.) Consequently, a semiconductor "tool" can be defined as a device that performs a given function or functions on a given semiconductor product (e.g., a wafer), whereby some external material transport system is required to transport the semiconductor product to and from the tool (and, thus, from and to other tools).

Various deficiencies have been found to exist using the conventional semiconductor factory scheme as described above. These deficiencies typically relate to the problems associated with communication and control of the tools, and can have effects on both the quantity and quality of the final (and intermediate) semiconductor products. Some of these deficiencies are described below.

Conventional semiconductor processing facilities contain tools whose individual output (in terms of quantity and/or quality) is controllable, and can be set to some amount/specification for a given tool. However, each tool is just one part of the overall wafer production process. Furthermore, the output of a given tool typically results in at least some variation from wafer to wafer. Consequently, in order to accurately control the quality and quantity of the final output resulting from the work of multiple tools, it would be desirable to effectively coordinate the efforts of the multiple tools by, e.g., facilitating enhanced communication to and between tools. This would more readily facilitate, for example, 1) allowing a tool to send information forward to a second tool to compensate for the variations in the output (in terms of quantity and/or quality) of the previous tool, and/or 2) allowing a tool to notify a previous tool of a variation so that the previous tool can compensate by modifying its procedures for the benefit of subsequently-processed products. However, protocols (which are currently very host-centric) do not currently exist to readily facilitate communication among tools. Consequently, what is needed is a scheme to facilitate communication between two or more tools so that the final product output from a combination of tools can be more accurately controlled, adjusted and predicted.

Another problem with conventional semiconductor processing facilities relates to the modification of recipes for particular semiconductor products being processed in the semiconductor processing facility. (A "recipe" is a sequence of steps that one or more semiconductor products are directed to go through within a given tool and/or series of tools.). Conventionally, if a recipe needs to be modified for a particular purpose (e.g., one or more individual semiconductor products needs to be specially treated), the entire recipe would become corrupt (e.g., the recipe would be changed and also there is no tracking or recording of the modifications made to the recipe for the individual semiconductor products. Consequently, what is needed is a scheme to systematically implement, track and record modifications made to an initial recipe for particular individual semiconductor products (e.g., such as semiconductor wafers) without corrupting the entire recipe.

Another deficiency with conventional schemes relates to determining whether a tool or set of tools, capable of producing a number of different products, and capable of implementing a number of different steps, is prepared to produce a particular semiconductor product that has been requested by the semiconductor processing facility (e.g., requested by the host computer 104), and/or is prepared to implement required/requested step(s). Here, examples of the different products are particular types of central processing units. Knowledge of such information is clearly important so that proper planning can be undertaken before materials are sent to the various appropriate tools in the semiconductor processing facility. Consequently, what is needed is a scheme for determining whether a tool or series of tools are ready for the production of a particular semiconductor product and/or for the implementation of required/requested steps. Knowledge of related information, such as when a tool or tools will be undergoing some type of maintenance (e.g., preventive maintenance), is also desirable to obtain in conjunction with whether one or more tools are ready for producing a given semiconductor product.

Yet another problem with conventional schemes relates to conveying historical (and related) information specifically regarding one or more semiconductor products to specific tools within the semiconductor processing facility as the semiconductor product(s) travel to those tools for processing or inspection. While conventional schemes can convey process or inspection information about semiconductor product(s) to the host computer 104 (for use in any number of disparate ways), these schemes do not actually and automatically associate information about the semiconductor product with the semiconductor product as it travels through the semiconductor processing facility or make this information available to process and inspection tools. Consequently, what is needed is a scheme for associating historical (and related) information with a semiconductor product as it travels (and is processed) through a semiconductor processing facility.

Because of the deficiencies mentioned above, tools need to be shut down for maintenance more frequently than might otherwise be the case. Specifically, when a semiconductor product is processed by a tool, the resultant semiconductor product typically contains at least some variance (e.g., in terms of crystalline structure and/or physical specification) from what is optimally desired. This variance can occur due to any number of factors, including 1) that parts of the tool are wearing down and/or, 2) that the tool is in a foundry environment, where it is requested to participate in the production of many different products over a relatively short amount of time (and the switching from one product to another does not, e.g., fully recalibrate certain aspects of the tool). At some point, if the variance becomes too great (despite efforts to, e.g., adjust the controls on the tool), the resultant semiconductor product will be unacceptable, and the tool causing the variance will need to be shut down for maintenance. However, if there were some way to convey variance information (e.g., historical and related information) to a subsequent tool, and the unacceptable variance can be compensated for by that subsequent tool, then the tool causing the variance could continue to operate without the need for a maintenance shut down. Allowing a tool causing the variance to operate for a longer period of time without requiring maintenance would clearly be beneficial from a cost and yield perspective.

SUMMARY OF THE INVENTION

The present invention alleviates the deficiencies of the prior schemes mentioned above by providing a system, method and medium for facilitating communication among tools in a semiconductor (e.g., wafer) processing facility. In particular, the present invention provides greater control of the overall semiconductor product output of groups of tools in terms of the quantity and/or quality of a final semiconductor product. Embodiments of the present invention contemplate that this is implemented by providing enhanced communication among a group of tools which form a "module" (where the module is contemplated to provide some designated function or functions). This communication can be facilitated via a module control mechanism, which could be a separate "module controller," and/or computer/communications facilities residing in the individual tools themselves. This enhanced communication allows for more effective feedback and feed forward capabilities so that variations found in a particular semiconductor product can effectively and automatically trigger appropriate compensation mechanisms.

More specifically, the present invention contemplates implementing the above-mentioned concepts by providing that modifications to a recipe can be made to one or more semiconductor products without it affecting (e.g., corrupting) the entire recipe. Also, such special modifications are recorded, so that they can be noted by subsequent (or previous) tools. As part of (or possibly separately from) this, the present invention also contemplates that a "traveling information" file can be associated with one or more wafers, and travel with the one or more wafers throughout the semiconductor processing facility.

In addition, the present invention also provides facilities to query one or more tools to determine whether or not the tools are ready for the production of a specified semiconductor product (and when in the tool's maintenance cycle some type of maintenance is scheduled to occur) and/or for the implementation of required/requested steps so that appropriate actions can be taken.

BRIEF DESCRIPTION OF THE DRAWINGS

Various objects, features, and attendant advantages of the present invention can be more fully appreciated as the same become better understood with reference to the following detailed description of the present invention when considered in connection with the accompanying drawings, in which:

FIG. 4*a* illustrates three possible states of a tool in response to a tool status request.

FIG. 4*b* depicts exemplary steps for querying (and receiving information from) a tool, as contemplated by embodiments of the present invention.

FIG. 6 depicts an exemplary format of the traveling information file.

DETAILED DESCRIPTION

The present invention relates to the control of tools and the communication among tools in a multi-tool semiconductor processing environment. More specifically, embodiments of the present invention relate to a system, method and medium for control of and communication among wafer processing tools in a wafer processing environment.

While it should be understood that aspects of the present invention can relate to any number of types of semiconductor products (hereafter "products"), for the purposes of example and discussion herein, the particular type of semiconductor product referred to shall typically be envisioned to be a "wafer."

Aspects of the present invention (and embodiments thereof relate to facilitating communication between two or more tools in a wafer processing facility for the purpose of synergistically achieving a greater degree of control of the quality and/or quantity of the combined, final output of the tools (e.g., in a pre-set or user-specified manner). In various embodiments, these tools (for which such communication is facilitated) are grouped together into "modules" for performing certain specified functions. To facilitate the tool-to-tool communication to implement the specified functions, embodiments of the present invention contemplate the use of a "module controller," which is envisioned to be separate from (but is contemplated to be in communication with) a host computer. Embodiments of the present invention envision that the module controller may be a separate entity and/or some or all of its functionality can reside in the tools, themselves.

Figure 2:
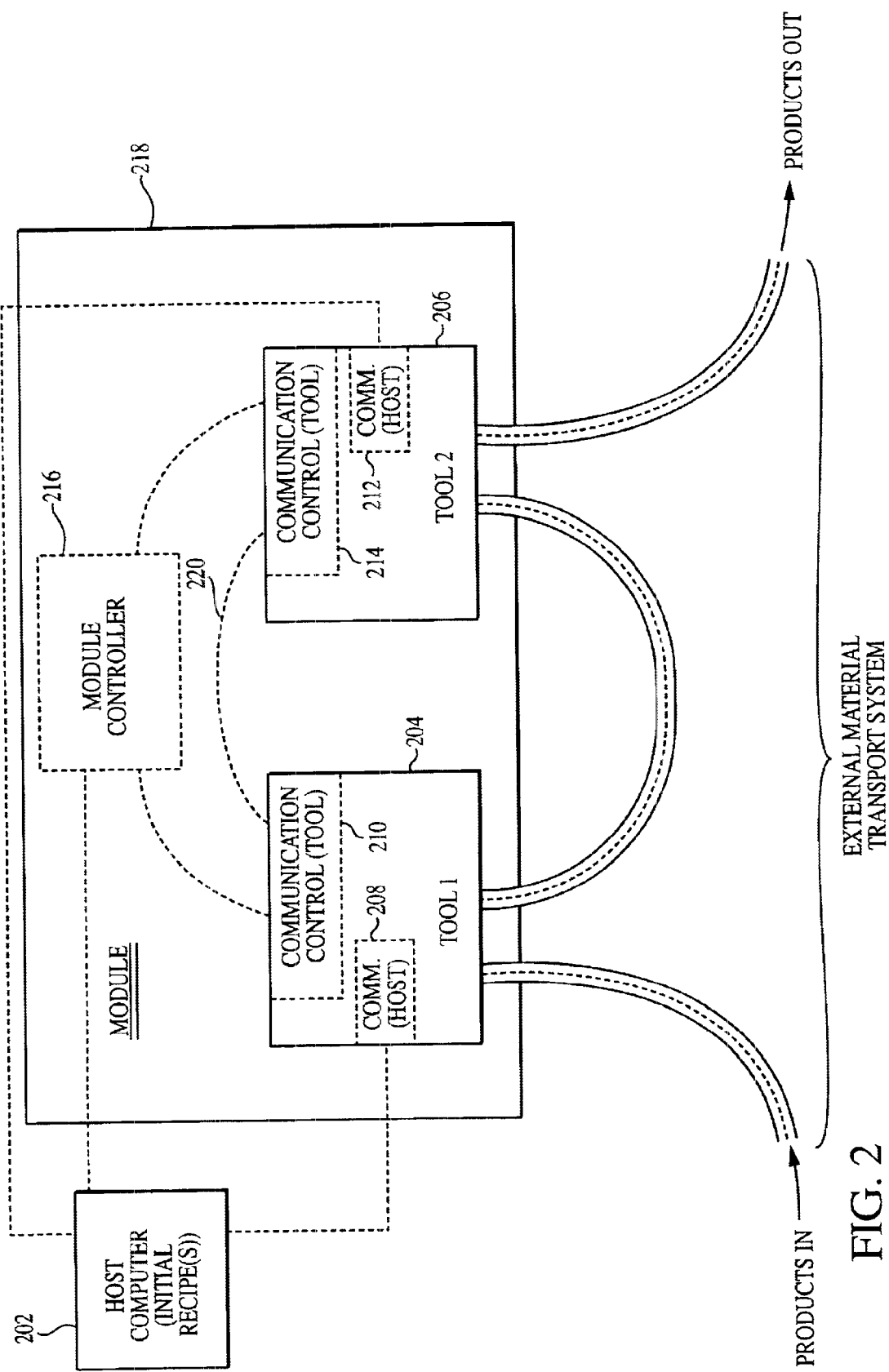
FIG. 2 is a block diagram depicting an exemplary module configuration of tools, as contemplated by embodiments of the present invention.

The module concept is now described in greater detail with regard to FIG. 2. Referring to FIG. 2, tool 1 (204) and tool 2 (206) are depicted to be part of a module 218 (where the collection of tools within module 218 is envisioned to perform one or more specified overall functions). At least some embodiments of the present invention contemplate that each of tools 1 and 2 (204 and 206, respectively) contains a communication control (210 and 214, respectively) which enables each of the tools (204 and 206) to communicate with each other directly (e.g., via a communication link 220) without the use of a separate module controller 216. In that situation, it is contemplated that the tools contain sufficient "intelligence" (e.g., the tools have a built-in computer mechanism within communication control 210 and/or 214 to process and communicate information relating to the wafers processed by the tools). This intelligence allows the tools to communicate directly with each other, utilizing at least some of the various protocols and techniques as described herein. In addition, embodiments of the present invention contemplated that this intelligence can reside in any one tool or it can be distributed in some manner among the various communication controls (e.g., 210 and 214) of the tools. Also, in this scenario, tools 1 and 2 will depend on various information (e.g., initial recipes) being received directly from the host computer (e.g., via host communication 208 and 212, and/or through a traveling information file as described below), since a separate module controller 216 would not be used.

Other embodiments of the present invention envision that some or all of the communication aspects between tools are routed through a module controller 216 that exists as a separate entity from the tools (204 and 206). In this scenario, it is contemplated that the host computer 202 is in communication with the module controller 216, and the module controller is in communication with the tools (204 and 206).

In either of the scenarios mentioned above with regard to, e.g., use, partial use or non-use of a separate module controller 216, the host computer 202 is generally contemplated as being used to control the overall function of the wafer processing facility (of which the module 218 is at least a part) and is in communication with that part of the module 218 that, e.g., receives instructions regarding product recipes or conveys tool status. Thus, host 202 exists and functions separately from the module controller 216 and from the tool-to-tool communication functionality thereof that might otherwise exist in the tools. Also, in either scenario, it is contemplated that a unifying protocol between the various components of the wafer processing facility alleviates the need to use station controllers, as described previously.

Embodiments of the present invention contemplate that at least a part of the purpose of the host computer 202 is to convey or select initial recipes for the tools, and also query the tools and initiate the production of a requested product using the tools. In addition, it is also contemplated that host computer 202 has at least some control with regard to any external material transport system that may be in use.

The dotted lines in FIG. 2 indicate connections and devices that may or may not exist depending particularly upon whether or not there is a separate module controller 216 being used (i.e., depending upon the particular embodiment contemplated).

It should be understood that embodiments of the present invention contemplate that a "module" can be a set, physical entity (e.g., three tools and a module controller) that is put together in a kind of discrete package to perform a pre-set function and/or a module can be defined within a multi-tool semiconductor processing environment (e.g., three existing tools in a factory can be chosen to perform a given function and caused to communicate to facilitate performance of that function) or, three tools can be dispersed within the factory and a wafer routed therethrough to facilitate a series of prequalified steps leading to a known overall result. It should also be understood that either of the above possibilities contemplate embodiments that use, an d that do not use, a separate module controller 216.

Embodiments of the present invention envision that any number of different types of tools could be used with any of the various "module" schemes described above (or in other non-module setting contemplated herein). A specific example of a module contemplated by embodiments of the present invention is one that envisions the usage of copper in the production of a wafer, for example to fill features such as vias, trenches and/or contacts which extend through an insulative layer previously deposited and etched while on the wafer. The exemplary tools that could be used in this module include 1) a "sputtering" tool to deposit a liner layer and a seed layer onto a wafer and the features in a film layer thereon for facilitating the further deposition of copper, 2) an "electroplating" tool to deposit copper onto the wafer to fill the features, and 3) a chemical/mechanical/polishing (CMP) tool to remove excess material after the electroplating process has been completed to facilitate further processing of the wafer. Thus, in this module, it is contemplated that a wafer will be passed through each of these above-mentioned tools in turn. Some embodiments of the present invention contemplate the use of a separate "metrology" tool to measure the thickness of the copper to determine how much polishing needs to be done by the CMP tool. (Alternatively, the "metrology" function can also be incorporated into one of the aforementioned tools, such as the CMP or electroplating tool, itself, in the form of, e.g., a metrology station.) Thus, the measuring of thickness and/or uniformity of a film (in this exemplary case, a copper film), and then using that measurement information to determine the polishing that is needed (e.g., how much, if any, to deviate from the amount of polishing otherwise specified by an initial recipe), are characteristic aspects contemplated by embodiments of the present invention.

In addition, the measurement of thickness and/or uniformity of a film within a multi-function (e.g., cluster) tool by a first functional unit and use of that measurement information to adjust a second functional unit (e.g., a polishing unit) within that same tool is also an aspect contemplated by various embodiments of the present invention. In such an instance, it is envisioned that many of the characteristics and features described herein (e.g., use of a module controller to effect communication among functional units) are applicable to this multi-function tool embodiment.

Another example of a "module" is one that uses a set of tools to perform a "deposition/etch" function. For this module, exemplary tools include 1) a deposition tool for dielectric film deposition, 2) a photolithography tool, 3) an etching tool, and 4) an inspection tool to inspect the results of the etching. As contemplated in this example, if inspection of a wafer by the inspection tool indicates that any of the previously-mentioned tools did not function as expected, then feedback can be given to those tools so that they can recalibrate themselves to produce a more desirable result for subsequent wafers that will go through the process. In this way, enhanced communication (whether facilitated by a module controller 216 or "intelligence" in the tools) thus facilitates enhanced quality of the wafers.

In the examples mentioned above, the tools can be made by any number of companies, such as Applied Materials of Santa Clara, Calif. or Nikon Corporation of Tokyo, Japan. Thus, the various embodiments mentioned above (e.g., use of the module controller 216 or enhanced intelligence implemented within communication control 210, 214) can be implemented using various ones of such tools. Some specific examples of tools manufactured by Applied Materials that can be used in the "deposition/etch" example mentioned above are as follows: the "dielectric deposition" tool can be the "Applied Producer" tool, the etch tool can be the "Centura Etch," and the inspection tool can be the "Applied CD SEM" tool.

Of course, it should be understood that the present invention contemplates that any number of other different tools (in addition to what is mentioned above) can also be used, so long as they can be interfaced (with each other and with a host computer) using any existing or future-recognizable protocols such as TCP/IP, DCOM, SECS/GEM, CORBA and/or HSMS, and operating systems such as NT (from Microsoft Corporation of Redmond, Wash.). Also, it should be evident that any number of different types of tools are contemplated, such as processing tools and inspection tools.

Embodiments of the present invention envision that module controller 216 and/or communication control (210 and 214) in tools 1 and 2 and/or host computer 202 can contain standard computer components (such as those found in PC compatible processors) such as Pentium processors from Intel Corporation of Santa Clara, Calif.). (This is also discussed further below with regard to FIG. 10.)

The present invention contemplates the use of various embodiments to assist in facilitating the communication schemes (and other envisioned aspects) described above with regard to FIG. 2. It should be understood, however, that these various embodiments are, themselves, also contemplated for use separately from any use that may be associated with the "modules" as indicated above (and in some instances may not even be applicable to the module scheme). These various embodiments are now described below.

Figure 3:
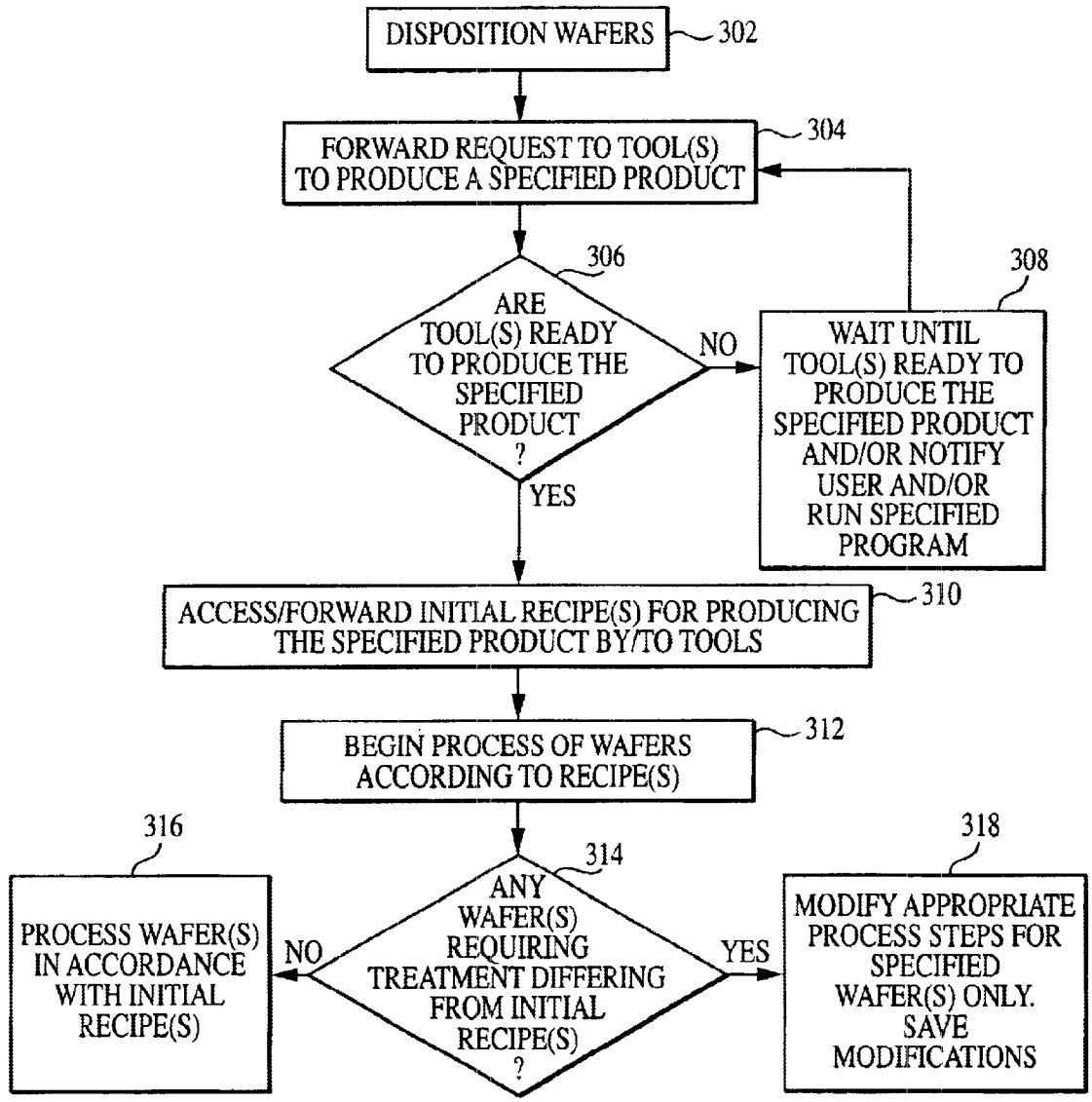
FIG. 3 shows a flow diagram depicting a method of operation for implementing various tool-related communication schemes as contemplated by embodiments of the present invention.

A method of operation for implementing some of the various embodiments that assist in facilitating communication schemes as alluded to above are now discussed with regard to FIG. 3. Referring to FIG. 3, the first step is that wafers are dispositioned (i.e., committed to production), as indicated by a block 302. Thus, in this step it is contemplated that the semiconductor processing facility (or some portion thereof) dispositions wafers (in some initial or intermediate state) to be processed into some finished (or at least intermediate) product.

The next step is that a request is forwarded to the tool(s) in the wafer processing facility to produce a specified product, as indicated by a block 304. (The tools receiving this request can, e.g., be part of a "module.") In embodiments contemplated by the present invention, such a request could be forwarded, for example, by a host computer.

The next step is to determine whether the tool(s) are ready to produce the specified product, such as a specific film layer having specified characteristics or features, re, crystalline structure, reflectivity, flatness, etc., as indicated by a decision block 306. (Embodiments of the present invention also contemplate that a determination can be made regarding whether one or more tools are ready to implement some specifically requested or required step or steps.) As will be discussed further below, a tool may not be ready to produce a product for any number of reasons, including that the tool is currently only ready to produce an entirely different product (where the tool is capable of producing multiple products) or that the tool is off-line because it is undergoing maintenance. Thus, where a tool is not ready to produce a requested product, any number of actions can be taken, including waiting until the tool (or tools) is ready to produce a specified product and/or notify the user of the status of the tool and/or run some specified program which will take some designated action. This is indicated by a block 308.

If the necessary tool(s) are ready to produce the specified product, then one or more initial recipes can be accessed (e.g., requested) by the appropriate tools or forwarded to the tools by a host computer, so that the tools will process the wafers as instructed. This is indicated by a block 310. Then, the next step is to begin processing wafers according to one or more recipes, as indicated by block 312.

During the course of processing the wafers in accordance with the recipes, it may be the case that one or more wafers need to be processed somewhat differently than would otherwise be indicated by an initial recipe. For example, if a wafer is etched at one stage of the processing, it may be desirable at a subsequent stage to treat that wafer somewhat differently to compensate for variations in the etch process not consistent with a desired goal. Consequently, it is envisioned that a determination is made as to whether any wafer or wafers require treatment differing from the initial recipe(s), as indicated by a block 314. If the answer is "yes," then the appropriate steps of the recipe are modified only for the specified wafer(s) needing special treatment, as indicated by a block 318. The remaining wafers are still processed in accordance with the initial recipes steps. Any special modifications that were made to any of the wafers are recorded for subsequent potential retrieval so that the history of any of the specially modified wafers can be ascertained (e.g., by a subsequent tool or the host). In this way, modifications are implemented and kept track of, while the initial recipe is kept intact for the remaining wafers that were not in need of any special modification.

For wafers not requiring any treatment differing from the initial recipe(s), then those wafers are processed in accordance with the initial recipe(s) as indicated by a block 316.

It should be understood that the steps (and sequence thereof) as depicted and discussed with regard to FIG. 3 are merely by way of example, and that the present invention contemplates the use of additional steps, as well as various modifications of those steps mentioned.

As indicated above, embodiments of the present invention contemplate the use of tools capable of potentially participating in the manufacture of any number of different products. To coordinate the effort to produce a given product, embodiments of the present invention contemplate that those tools involved in the production process are capable of receiving certain types of commands from, and conveying status (e.g., availability) information to, some central command/initiation computer such as a host computer. As an example of this, embodiments of the present invention contemplate that a status inquiry may be undertaken with regard to whether one, several, or an entire factory of tools are currently "ready" for the production of a specified product.

Various embodiments of the present invention contemplate that any given product that can be manufactured by the wafer processing facility (and thus, which a tool can participate in the manufacture of has a specified Product ID associated with it. Thus, where it is desired to produce a given product, a status request is sent (e.g., by a host computer) to determine whether a tool (and/or all tools that would be involved in the process) are ready to participate in the manufacture of the desired product. In response to this status request, a "tool status" is then returned for each tool, indicating the status of the particular tool for the request as given.

An exemplary form of the "tool status" that is returned by a tool as contemplated by embodiments of the present invention is shown at FIG. 4a. Referring to FIG. 4a, this example depicts three different possible states that a given tool (having a specified "Tool ID") can have (in actual use, it is envisioned that only one of these states is actually returned by the tool). In state one, the tool has indicated that it is ready to participate in the production of the product that has been requested. When this state is returned, it is returned with certain other items of information, including the time until the tool becomes inactive due, e.g., to the fact that it undergoes some type of maintenance (e.g., preventive maintenance [pm]), and the number of wafers that the tool may process before the maintenance occurs. In embodiments of the present invention, this information can be important since, even if the tool indicated that it is "ready for production" of a particular product, it may be scheduled to undergo maintenance in a short period of time. In that case, the controlling entity (e.g., host computer) may decide to postpone production of the desired product until after the maintenance, and may even command the tool to immediately initiate the maintenance procedure (so that production of the desired product can begin that much earlier).

A second possible state that can be returned (as shown in this example of FIG. 4a) is one where the tool is currently down for maintenance. In that case, as contemplated by embodiments of the present invention, an item of information returned with that state includes the time remaining until the tool is back up for production.

A third possible state that can be returned as contemplated by embodiments of the present invention is that the tool is "currently running" some other job (e.g., involved in the production of some other product). In that state, it is contemplated that the number of wafers before completion of the currently-running job is returned, as well as a time and number of wafers until maintenance. In addition, embodiments of the present invention also contemplate that, where a particular product requested is not the same as the one currently running and some time is required to re-set the tool in order for it to participate in making the requested product, then that amount of time will also be returned.

It should be understood that the present invention contemplates the usage of any number of different states and/or the ability to return and process any number of different items of information. In addition, embodiments of the present invention contemplate that the information returned in a "tool status" can indicate which of possibly multiple steps that the tool performs in its participation of making a given product are "ready." Thus, for example, a particular tool may implement three different steps while participating in the production of a particular product, but at a given point in time the tool may be ready to implement only two of them. In addition, it is also contemplated that some central command (e.g., host) computer could also directly poll a tool as to whether it is ready to implement some specified step that the tool may generally be capable of implementing.

A sequence of exemplary steps for requesting the manufacture of a particular product in accordance with the principles mentioned above is now discussed with regard to FIG. 4b. Referring to FIG. 4b, the control entity (e.g., host computer) sends out a tool status request, as indicated by a step 1. This can be in the form of a list of one or more product ID's sent to a single tool, across two or more tools, or even to all tools in a wafer processing facility.

Step 2 indicates that the "tool status" has been sent by the tool to the control entity (e.g., host) (e.g., as was discussed with regard to FIG. 4a above).

Once an indication has been sent that the necessary tools are ready to make the requested product, then in step 3, a "tool service request" is initiated (containing the relevant product ID and/or tool ID's) to initiate the manufacture of the product or to perform some tool service (e.g., maintenance). Since various events could occur between the time that the "tool status" of step 2 is received and the time that the tool service request is initiated (e.g., a tool could have broken down), embodiments of the present invention contemplate that the host computer then waits to receive an indication whether the tool service request has been granted or rejected, as indicated by step 4. If service is "granted," the tool service will start, as indicated by step 5. (Otherwise, if service is rejected, or if no response to the tool service request is received (and a "time-out" occurs), then the tool service will not be initiated.)

If tool service has been initiated, then when completed, the tool will send, e.g., the host computer a "tool service completed" message, as indicated by step 6.

It should be understood that the various states and parameters of FIG. 4a and steps of FIG. 4b are examples contemplated by the present invention, and that the present invention envisions that any number of different types of parameters, steps, etc. can also be used to implement the features contemplated herein.

Embodiments of the present invention contemplate that historical information pertaining to groups (e.g., "cassettes") of wafers or even to a single wafer be recorded, and that this information "follow" the wafers (or wafer) through the journey through the wafer processing facility. In this way, if a wafer was processed by a given tool such that an undesirable variation occurred, then this recorded information will be following the wafer to a subsequent tool, where appropriate compensation for the variation can take place. Thus, for example, if the information associated with a given wafer indicates that it was heated to a less than adequate temperature within a certain tool, a subsequent tool receiving the wafer may be able to utilize this recorded information to compensate for the effects of reduced temperature.

Figure 5:
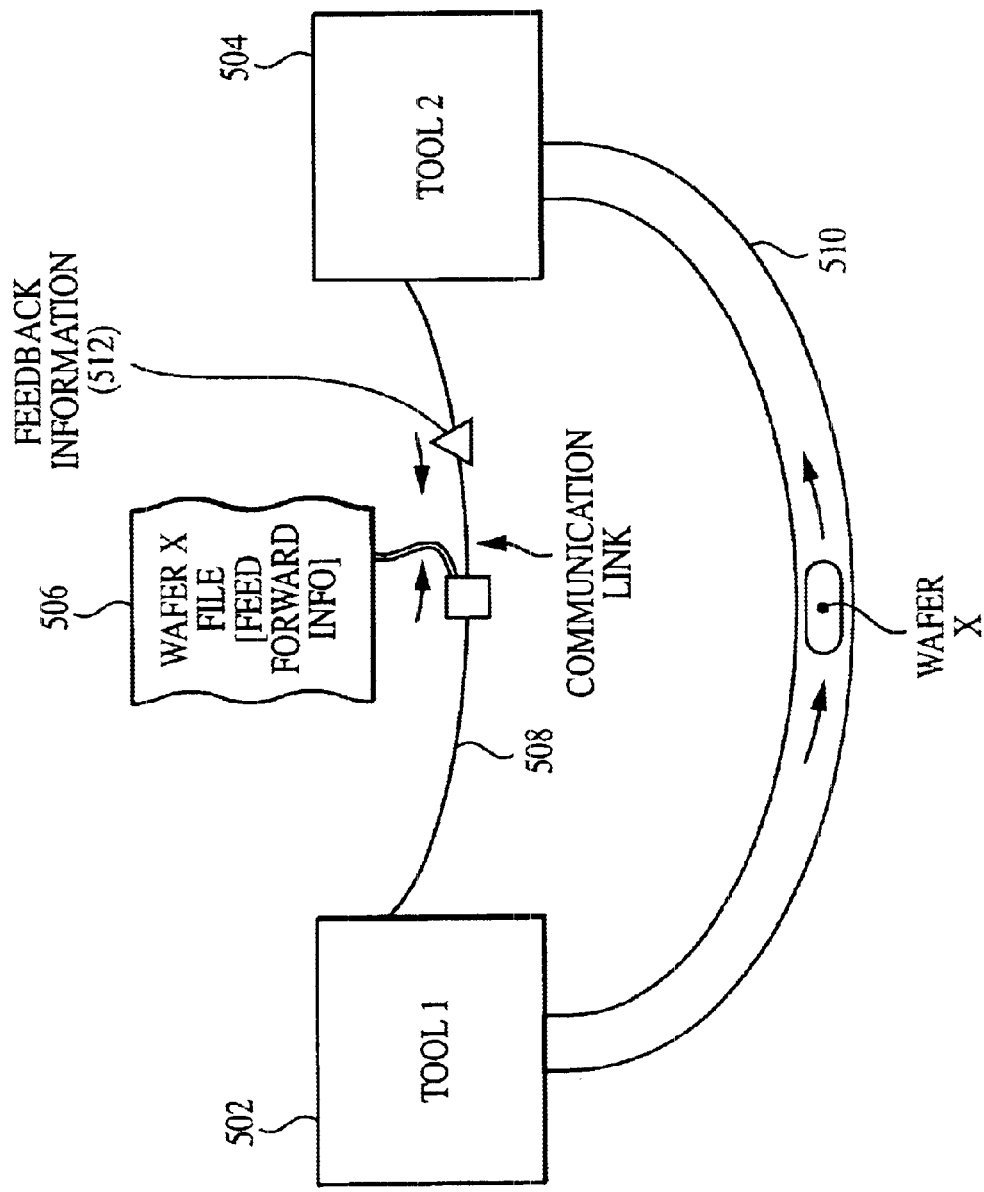
FIG. 5 is a block diagram depicting a traveling information file associated with one or more wafers, as contemplated by embodiments of the present invention.

A scheme for implementing the wafer information recordation as described above is depicted by FIG. 5. Referring now to FIG. 5, a Wafer X is shown as being conveyed from a tool 1 (502) to a tool 2 (504) via an external material transport system 510, which may be either manual or automated. In addition to wafer X itself, a traveling information file (referred to in this example here as "Wafer X file") 506 is also conveyed via a communication link 508 from tool 1 (502) to tool 2 (504). (Embodiments of the present invention contemplate that tool 2 could automatically be passed the Wafer X file, or that it would request the Wafer X file upon receipt of Wafer X. In the latter case, such request could be made directly of tool 1 and/or of some module control mechanism. In either case, control of the Wafer X file gets transferred to tool 2.)

The Wafer X file 506 mentioned above can contain any number of different items of information which may be relevant in the processing of a wafer (to make a desired product) as it is processed by the appropriate tools in the wafer processing facility. As indicated by Wafer X file 506, such information can be "feed forward information," meaning that it can contain information which indicates how the Wafer X should be treated differently than Would otherwise be indicated by the initial recipes. Depending upon the variation as recorded in the wafer history (i.e., in the Wafer X file), deviations from the initial recipe(s) can be a difference in one step on a single tool, or multiple steps over several tools. Generally, it is envisioned that whatever corrective measures need to be taken to compensate for the variation would be implemented.

As an example of a specific application of the use of a traveling information file such as Wafer X file 506 of FIG. 5 and environments used therewith, tool 2 (504) can be a CMP apparatus, and tool 1 (502) can be a metrology device that can generate information about a wafer and store it in the traveling information file. Assuming that a thickness or uniformity profile (e.g., an indication of the thickness or uniformity of a wafer layer as a function of the position on the wafer) can be derived from the "feed forward" information in the traveling information file, the CMP apparatus can then use that information to improve the polishing uniformity and compensate for variations that occurred at previous tools. Thus, if one radial region of the layer on the wafer is thicker than another region, the CMP apparatus can use the feed forward information to determine a plurality of pressures that will be applied to the different radial regions of the wafer. By applying a higher pressure to the thick region, material may be preferentially removed from the thick region, thereby improving the planarity of the resulting wafer and compensating for variations in a prior tool. An example of a chemical mechanical polishing system that can apply preferential pressures to a wafer is described in provisional U.S. application Ser. No. 60/143,219, filed Jul. 9, 1999, the entire disclosure of which is incorporated by reference.

While the description of FIG. 5 above has been in terms of a single wafer, it should be understood that the present invention also contemplates that the history of a group of wafers (e.g., a cassette or lot of wafers), to the extent that they have been treated substantially the same in at least certain instances, can also be recorded in a traveling information file and follow the group as it travels through the wafer processing facility.

In addition to, or in conjunction with, the use of the traveling information file, embodiments of the present invention also contemplate that feedback information can be utilized. Thus, for example, should one or more traveling information files which are received by tool 2 from tool 1 indicate that there is a variation with tool 1 which needs to be compensated for, feedback information 512 can be sent from tool 2 to tool 1 indicating to tool 1 that certain aspects of tool 1 need to be adjusted. (Embodiments of the present invention contemplate that this feedback can, in effect, be in the form of a copy of the traveling information file 506.) In this way, once tool 1 makes these adjustments, subsequent wafers can be processed in a desirable fashion.

It should be understood that the concepts described herein, particularly with regard to FIG. 5, result in certain distinct advantages relating to the present invention. For example, implementation of the "feed forward" concept as described above may allow a given tool to produce wafers with a greater variance (in terms of, e.g., crystalline structure and/or physical dimension) than would otherwise be acceptable in the course of producing a given semiconductor product, since a subsequent tool can then compensate for this variance. A result of this is that the necessity to shut an individual tool down (or slow its production) for maintenance purposes (so that the product the tool provides would be within a range where subsequent (or precedent) process compensation would not be necessary), decreases. Since the tools are down for maintenance less of the time, yield increases, and the cost of maintaining the tools decreases. Similar advantages can also occur by the implementation of the aforementioned feedback concept. Situations where the feed forward and feedback concepts are contemplated to be applicable include where parts of a tool incrementally change product results over time and must otherwise be replaced before their "end of life" to ensure that the resulting product is within narrow specified limits, and/or in a foundry environment, where a tool is directed to participate in the production of a different semiconductor product from the one that it was previously participating in, and the process provided by the tool must be changed for its manufacture of the second semiconductor product.

Embodiments of the present invention also contemplate that various concepts discussed herein, and particularly those relating to FIG. 5 above, are also applicable with regard to the measurement of thickness and/or uniformity of a film within a multi-function (e.g., cluster) tool. Thus, it is envisioned that, e.g., a first functional unit within a cluster tool can obtain measurement information relating to the thickness and/or uniformity of a wafer, and convey that information to a second functional unit within the cluster tool (e.g., one that performs a polishing function). The second functional unit can then (if needed or desired) adjust its operation (e.g., the amount of polishing) in accordance with the received measurement information.

An exemplary format for a traveling information file containing information for a single wafer (particularly where inherent computer intelligence is contemplated to exist in the tools, as described above) is now shown and described with regard to FIG. 6. Referring to FIG. 6, a Tool ID indicates the given tool for which a set of actions (e.g., recipe steps) are to be taken. As can be appreciated, such a set of actions is contemplated to exist in the traveling information file for each tool that will be used to process each wafer (having a specified Wafer ID) to create the desired product. As can be seen in FIG. 6, there are n Steps associated with the process, each of which is associated with a recipe. Thus, in this example, n "initial" recipes (which, as indicated above, are contemplated by embodiments of the present invention to have come from the host computer) are to be implemented by the tool having "Tool ID" as shown.

In conjunction with the recipes, parameters associated with the wafer are also recorded. The "parameters" represent those specific aspects to be implemented by the tool that are variations from the initial recipe. For example, if a particular Tool ID represented a polishing tool, and the wafer at issue needed an additional 10 seconds of polishing beyond what was otherwise prescribed by the relevant recipe, the need for the extra 10 seconds would be recorded into the "parameters" associated with the recipe. Thus, the "parameters" are calculated (e.g., by one of the tools), and recorded in the course of the wafer traveling through the wafer processing facility.

The "data list" is envisioned to contain any number of items of data that may pertain to the wafer, such as temperature of the wafer at certain times in the wafer's history, wafer thickness, uniformity, etc. It is envisioned that it is the information in this data list that is used, for example, to determine whether the wafer needs to undergo treatment different from that prescribed by the initial recipe (thus causing additional information to be entered into the "parameters").

It should be understood that the format depicted by FIG. 6 as described above is by way of example, and that any number of different formats are also contemplated.

Figure 7:
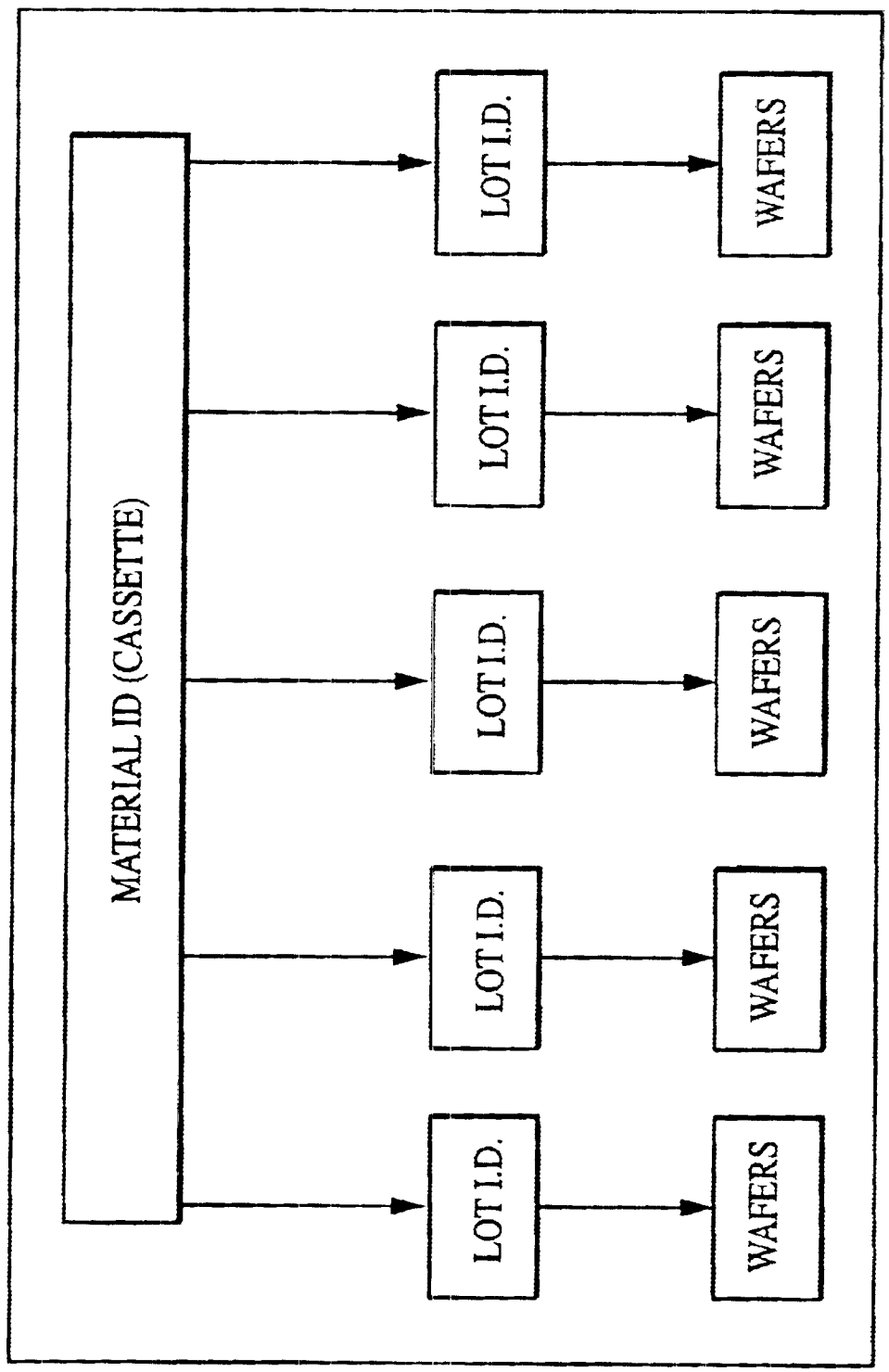
FIG. 7 depicts an exemplary hierarchy of IDs.

Typically, a tool in a wafer processing facility will receive wafers in various sized groups. Often, wafers will be sent to a tool in groups of one or more "cassettes," (comprising typically 25 wafers). Each cassette can have its own "Material ID (cassette ID)" associated with it. A "lot" (consisting of a number of wafers) will typically comprise multiple cassettes (or portions of a cassette), and can have their own associated "Lot ID." Finally, a "wafer" can, itself, have its own individual Wafer ID. One exemplary hierarchal structure for this is depicted by FIG. 7.

Figure 1:
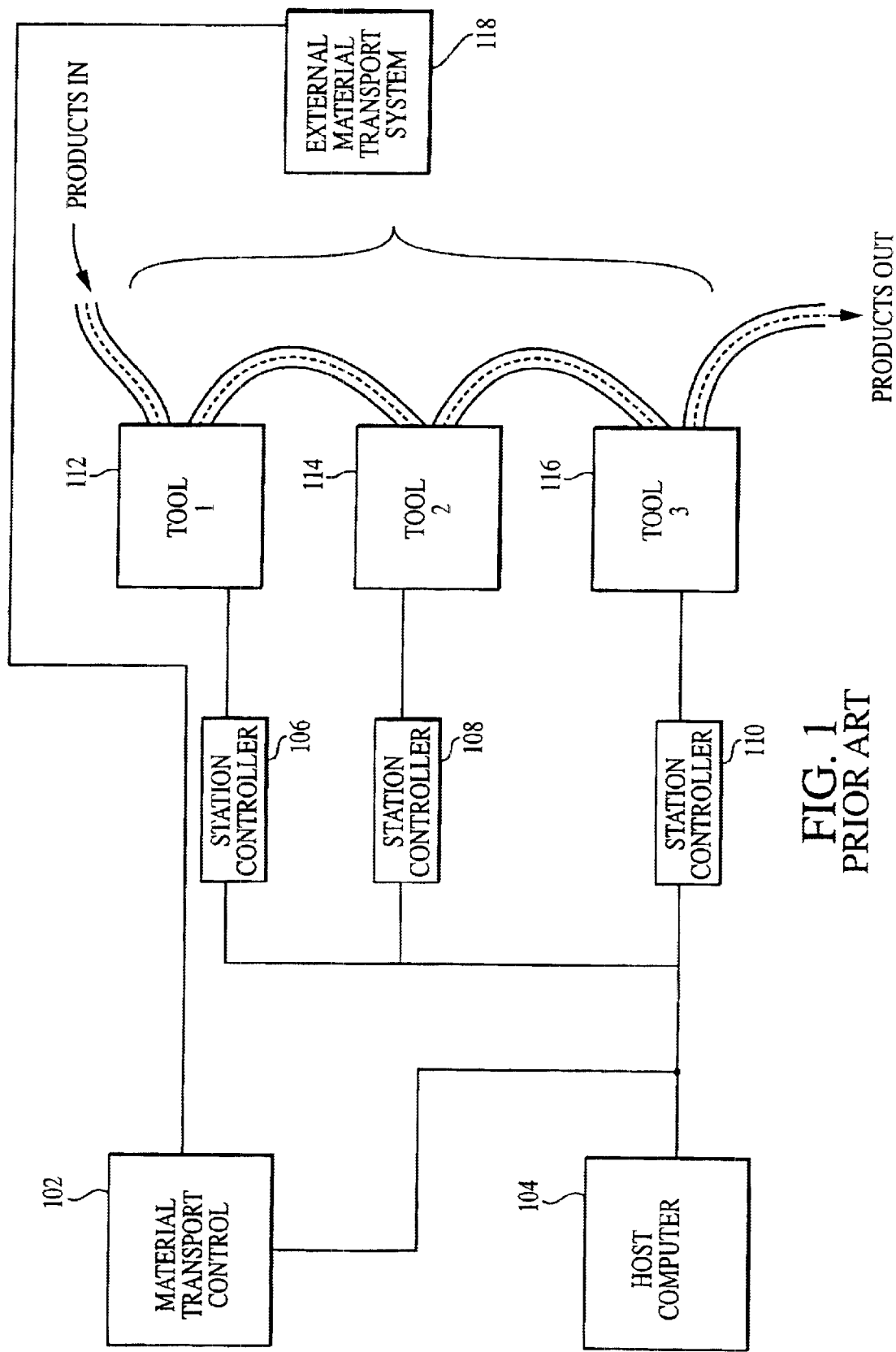
FIG. 1 is a block diagram showing a conventional semiconductor processing facility.
Figure 8A:
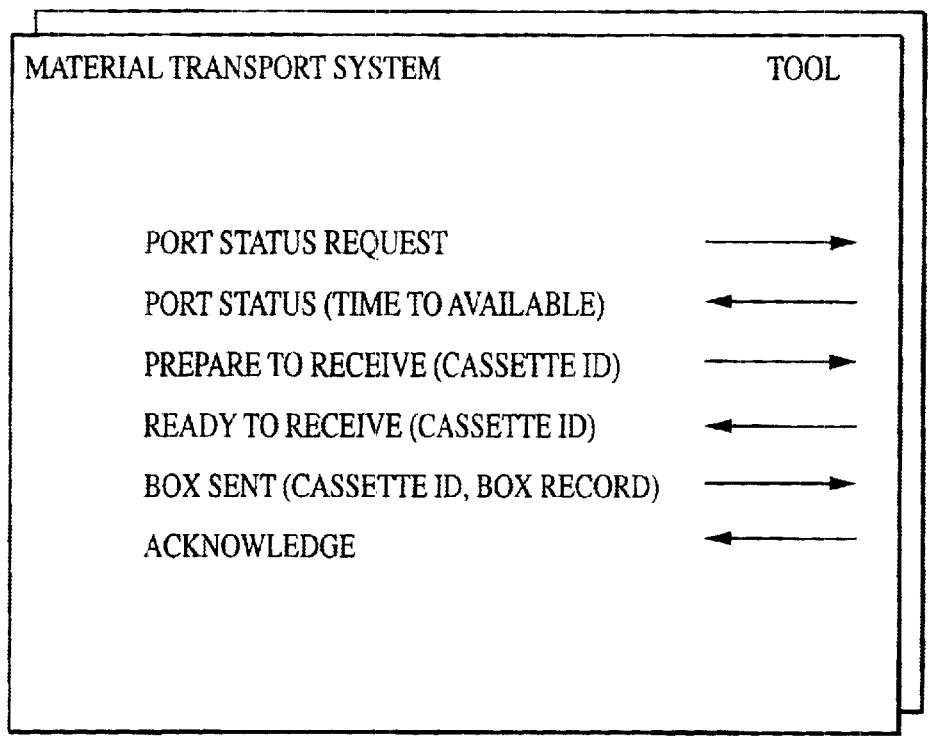
FIGS. 8*a* and 8*b* depict exemplary scenarios for communications involving the transport of materials through the semiconductor processing facility.
Figure 8B:
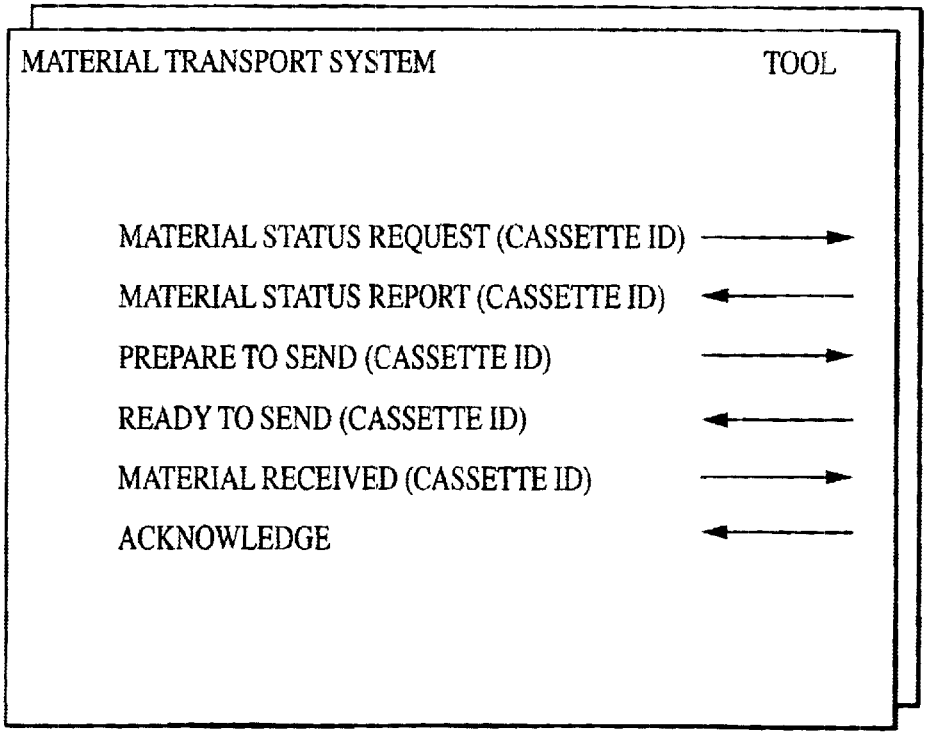

In addition to determining whether or not a tool or groups of tools are ready for the production of a given product, and in addition to conveying information about the status of a particular wafer's progress during processing, embodiments of the present invention also contemplate usage of, and operating within environments of, a material transport system, such as the type indicated in FIGS. 1 and 2. Further to the implementation of such a system, FIG. 8a depicts an exemplary scenario for the steps involved in the delivery of material (e.g., cassettes of wafers) from a material transport system (where the communicated information and/or materials emanate from a host computer/delivery system and/or another tool) to a tool, while FIG. 8b depicts an exemplary scenario for the steps involved in the retrieval of materials from a tool. As can be seen from FIGS. 8a and 8b, wafers at the cassette level (i.e., whole cassettes of wafers, each having a cassette ID) are what are being transported and queried. It should be understood, however, that any number of other types of scenarios, steps, and groupings of wafers are also contemplated for use with, and in environments of, the present invention.

Figure 9:
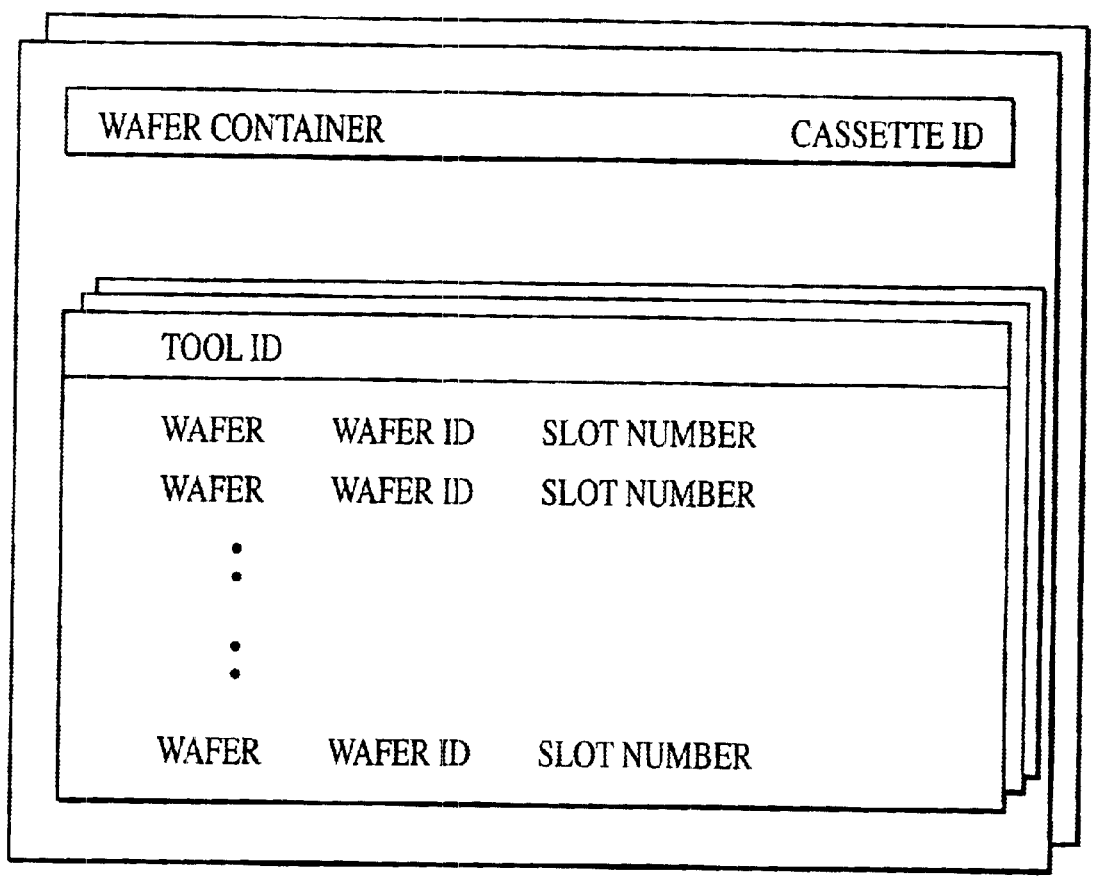
FIG. 9 depicts an exemplary form of information relating to wafers in a "cassette."

FIG. 9 depicts information regarding a cassette of wafers (having a particular cassette ID). This information can be conveyed to a tool so that the tool can associate a particular wafer with its wafer ID, as well as identify which physical "slot" in a cassette the particular wafer having a given wafer ID is located at. In this way, when a tool needs to, for example, implement (or modify) one or more steps in a different way from that which is otherwise dictated by a given recipe, the tool will know which "slot" the relevant wafer is in when the cassette is delivered from or removed from the tool.

Embodiments of the present invention contemplate potentially operating with tools that may place a given wafer in a different cassette than the one it entered the tool in. However, where this is the case, the present invention contemplates that this occurrence would be anticipated and kept track of, so that any appropriate information corresponding to a given wafer continues to be associated with that wafer.

Figure 10:
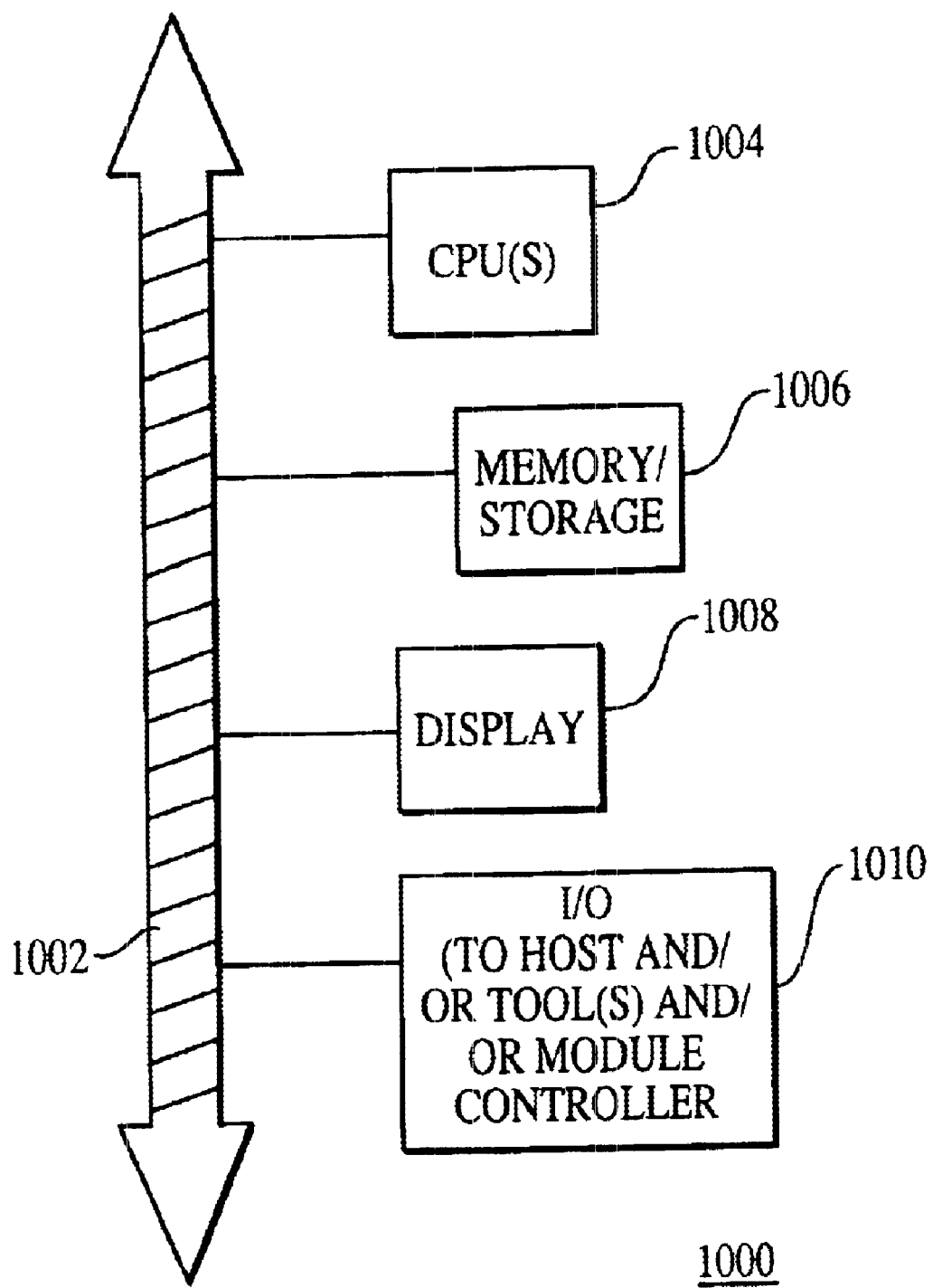
FIG. 10 depicts an exemplary computing device which can exist as (or be a part of) various entities described herein, including the host computer, tools and module controller.

Embodiments of the present invention contemplate the use of various computers and computer components either as, or as a part of, various entities such as the host computer, tools and/or module controllers, and/or for use in environments therewith. An exemplary depiction of such a computing device that could be used with embodiments of the present invention is shown at FIG. 10. Referring now to FIG. 10, CPU(s) 1004 are shown to be in communication with a memory/storage device 1006 via bus 1002. CPU(s) 1004 can be any number of different types of processors, including those manufactured by Intel Corporation or Motorola of Schaumberg, Ill. The memory/storage device 1006 can be any number of different types of memory devices such as DRAM and SRAM as well as various types of storage devices, including magnetic and optical media, and that the memory/storage device 1006 can also take the form of a communications transmission.

A display device 1008 is also shown, which could be any number of devices conveying visual and/or audio information to a user. Also in communication with bus 1002 is an I/O interface 1010 for allowing the computing device 1000 to interface with other devices, such as host computers, tools or module controllers, depending upon which device the computing device 1000 (or portion thereof) represents.

The computing device 1000 can be an off-the-shelf device such as a personal computer (e.g., an Intel-based device), or can be merely components on a "rack." Any number of operating systems, such as NT from Microsoft Corporation can be used. Also, it is further contemplated that computing device 1000 (and/or various components thereof) are connected via I/O 1010 using, e.g., the communications mechanisms as generally described above, which may comprise networking mechanisms and protocols such as DCOM, the HSMS protocol standard used by SECS/GEM, and/or network operating systems such as NT or Novell from Novell, Inc. of Provo, Utah.

Of course, it should be understood that the components described above are by way of example, and that the present invention contemplates that any number of different types of components and configurations can be used.

In general, it should be emphasized that the various components of embodiments of the present invention can be implemented in hardware, software or a combination thereof. In such embodiments, the various components and steps would be implemented in hardware and/or software to perform the functions of the present invention. Any presently available or future developed computer software language and/or hardware components can be employed in such embodiments of the present invention. For example, at least some of the functionality mentioned above could be implemented using the C, C++, or any assembly language appropriate in view of the processor(s) being used. It could also be written in an interpretive environment such as Java and transported to multiple destinations to various users.

It is also to be appreciated and understood that the specific embodiments of the invention described hereinbefore are merely illustrative of the general principles of the invention. Various modifications may be made by those skilled in the art consistent with the principles set forth hereinbefore.

What is claimed is:

1. A method of processing wafers in a wafer processing facility, said wafer processing facility comprising at least two wafer processing tools, each for providing a distinct function, the method comprising the steps of:

(1) dispositioning, by the wafer processing facility, a discrete number of wafers to be processed;

(2) conveying, to said at least two wafer processing tools, a request to produce a specified product from each of said discrete number of wafers, and determining from said at least two wafer processing tools whether said request can be granted;

(3) upon determining in said step (2) that said specified product can be produced, accessing an initial recipe, said initial recipe for directing said discrete number of wafers through a plurality of process steps using said at least two wafer processing tools, to produce said specified product;

(4) upon receipt of information relating to a characteristic of at least one of said discrete number of wafers:

(i) modifying, where required, at least one of said process steps of said initial recipe for said at least one of said discrete number of wafers, (ii) continuing to utilize said initial recipe for those of said discrete number of wafers not modified by said step (i);

(5) storing said modification made to said initial recipe for said one of said discrete number of wafers, for potential future use.

2. The method of claim 1, further comprising the steps of:
(6) implementing a first function on said at least one of said discrete number of wafers, using a first tool of said at least two wafer processing tools, to produce a first output;
(7) implementing a second function on said at least one of said discrete number of wafers, using a second tool of said at least two wafer processing tools, to produce a second output, said second tool receiving as input said first output from said first tool; and
(8) measuring and obtaining measurement data relating to one of the first and second outputs produced by one of said first or second tools, and conveying said measurement data to the other of said first or second tools for use in modifying a behavior of said other of said first or second tool.

3. The method of claim 2, further comprising the step of:
(9) facilitating the communication of information between said first tool and said second tool so that said at least two wafer processing tools yield said specified product, said specified product being, or resulting from, said second output.

4. The method of claim 3, wherein at least some aspects of said step (9) are controlled by a controller for said at least two wafer processing tools.

5. The method of claim 3, wherein at least some aspects of said step (9) are controlled by either said first or second tools, or by a combination of said first and second tools.

6. The method of claim 3, wherein said information communicated between the first and second wafer processing tools is directed to measurement data.

7. The method of claim 6, wherein said measurement data relates to the thickness and/or uniformity of a film.

8. The method of claim 1, wherein one of said at least two wafer processing tools includes at least one of a deposition function, a CMP function, an etch function, and an electroplating function.

9. The method of claim 1 further comprising the step of:
delaying step (3) until said request is granted.

10. A method for associating information with a wafer in a semiconductor processing facility, comprising the steps of:
(1) processing a wafer at a first wafer processing tool, and storing first information pertaining to said wafer on a traveling information file,
wherein said traveling information file comprises information pertaining to the status of said wafer;
(2) transferring said wafer to a second wafer processing tool;
(3) transferring said traveling information file with said wafer to said second wafer processing tool;
(4) receipt of said traveling information file by said second wafer processing tool; and
(5) processing said wafer at said second processing tool using said first information in said wafer status file, and storing second information pertaining to said wafer on said traveling information file, wherein traveling information file contains a recipe, and wherein said first wafer processing tool comprises the step of using said recipe in said traveling information file to process said wafer.

11. The method of claim 10, wherein said traveling information file further includes information relating to a number of additional recipes.

12. The method of claim 11, wherein said traveling information file further includes information relating to identifications of wafer processing tools to perform said number of additional recipes.

13. The method of claim 10, wherein said traveling information file further includes parameters that represents variations from said recipe.

14. The method of claim 10, wherein said second information relates to at least one of temperature of said wafer at certain times in said wafer's process history, wafer thickness, and uniformity.

15. The method of claim 10, further comprising the step of:
determining a treatment for said wafer different from said recipe based on the second information.

16. The method of claim 10, wherein one of said first and second wafer processing tools includes at least one of a deposition function, a CMP function, an etch function, and an electroplating function.

17. A method for associating information with a wafer in a semiconductor processing facility, comprising the steps of:
(1) processing a wafer at a first wafer processing tool, and storing first information pertaining to said wafer on a wafer information entity,
wherein said wafer information entity comprises information pertaining to the status of said wafer;
(2) transferring said wafer to a second wafer processing tool;
(3) transferring said wafer information entity with said wafer to said second wafer processing tool;
(4) receiving said wafer information entity by said second wafer processing tool;
(5) processing said wafer at said second processing tool using said first information in said wafer information entity, and storing second information pertaining to said wafer on said wafer information entity, wherein wafer information entity contains a recipe or a modification of said recipe, and wherein said first wafer processing tool comprises the step of using said recipe or said modification of said recipe in said wafer information entity to process said wafer.

18. The method of claim 17, wherein said traveling information entity further includes information relating to a number of additional recipes.

19. The method of claim 18, wherein said traveling information entity further includes information relating to identifications of wafer processing tools to perform said number of additional recipes.

20. The method of claim 17, wherein said traveling information entity further includes parameters that represents variations from said recipe.

21. The method of claim 17, wherein said second information relates to at least one of temperature of said wafer at certain times in said wafer's process history, wafer thickness, and uniformity.

22. The method of claim 17, further comprising the step of:
determining a treatment for said wafer different from said recipe based on the second information.

23. The method of claim 17, wherein one of said first and second wafer processing tools includes at least one of a deposition function, a CMP function, an etch function, and an electroplating function.

24. The method of claim 17, wherein said traveling information entity is a computer readable file.

* * * * *

UNITED STATES PATENT AND TRADEMARK OFFICE
CERTIFICATE OF CORRECTION

PATENT NO. : 6,640,151 B1  
DATED : October 28, 2003  
INVENTOR(S) : Sasson Somekh et al.

Page 1 of 1

It is certified that error appears in the above-identified patent and that said Letters Patent is hereby corrected as shown below:

<u>Title page,</u>  
Item [56], References Cited, U.S. PATENT DOCUMENTS, please insert:  
-- 09/363,966    07/1999  Arackaparambil et al.  
3,767,900        10/1973  Chao et al.  
3,920,965        11/1975  Sohrwardy  
4,368,510        01/1983  Anderson  
4,616,308        10/1986  Morshedi et al.  
4,663,703        05/1987  Axelby et al.  
5,347,446        09/1994  Iino et al.  
6,128,016        10/2000  Coelho et al.  
6,219,711        04/2001  Chari  
6,249,712        06/2001  Boiquaye  
6,278,899        08/2001  Piche et al.  
2001/0040997     11/2001  Tsap et al.  
2002/0128805     09/2002  Goldman et al. --  
FOREIGN PATENT DOCUMENTS, please insert:  
-- EP    EP 1 067 757    01/2001  
WO    WO 01/33277    05/2001  
WO    WO 01/33501 A1    05/2001  
WO    WO 02/31613 A2    04/2002  
WO    WO 02/31613 A3    04/2002 --  
OTHER PUBLICATIONS, please insert:  
-- Levine, Martin D. 1985. Vision in Man and Machine. New York: McGraw-Hill, Inc. pp. ix-xii, 1-58. Pilu, Maurizio. September 2001. "Undoing Page Curl Distortion Using Applicable Surfaces." IEEE International Conference on Image Processing. Thessalonica, Greece. 23 May 2003. Writtten Opinion for PCT/US01/24910. --

Signed and Sealed this

Thirteenth Day of April, 2004

JON W. DUDAS  
*Acting Director of the United States Patent and Trademark Office*